United States Patent [19]

Kamon

[11] Patent Number: 5,524,039
[45] Date of Patent: Jun. 4, 1996

[54] PROJECTION EXPOSURE APPARATUS

[75] Inventor: Kazuya Kamon, Itami, Japan

[73] Assignee: Mitsubishi Denki Kabushiki Kaisha, Tokyo, Japan

[21] Appl. No.: 375,736

[22] Filed: Jan. 20, 1995

[30] Foreign Application Priority Data

Jan. 31, 1994 [JP] Japan .................................. 6-009867

[51] Int. Cl.$^6$ .................................................. H01L 71/30
[52] U.S. Cl. ............................................... 378/34; 378/85
[58] Field of Search ................................. 378/34, 35, 84, 378/85; 250/492.1, 492.2

[56] References Cited

U.S. PATENT DOCUMENTS

| | | | |
|---|---|---|---|
| 5,003,567 | 3/1991 | Hawryluk et al. | 378/34 |
| 5,187,726 | 2/1993 | White | 378/34 X |
| 5,222,112 | 6/1993 | Terasawa et al. | 378/34 |
| 5,328,784 | 7/1994 | Fukuda | 378/35 X |
| 5,339,346 | 8/1994 | White | 378/34 |

*Primary Examiner*—David P. Porta
*Attorney, Agent, or Firm*—Leydig, Voit & Mayer

[57] ABSTRACT

In a projection optical system, synchrotron radiation light emitted from a beam source is reflected by a first mirror and travels through a stop to form a secondary light source surface at a position on a second mirror. The beam reflected from the second mirror is incident upon a reflection type mask on which a circuit pattern is previously formed. A pupil surface is formed at a position on a third mirror by the beam reflected from the mask. The beam reflected by the third mirror reaches a wafer. The circuit pattern on the mask is thereby transferred onto the wafer.

16 Claims, 24 Drawing Sheets

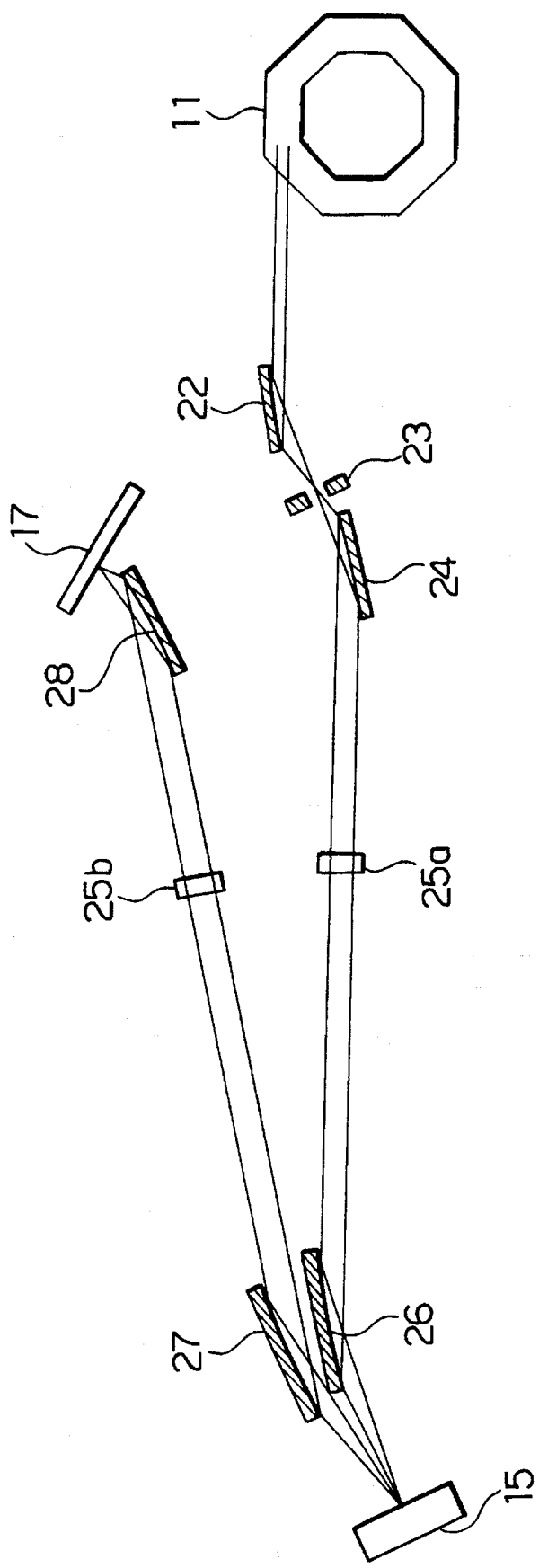

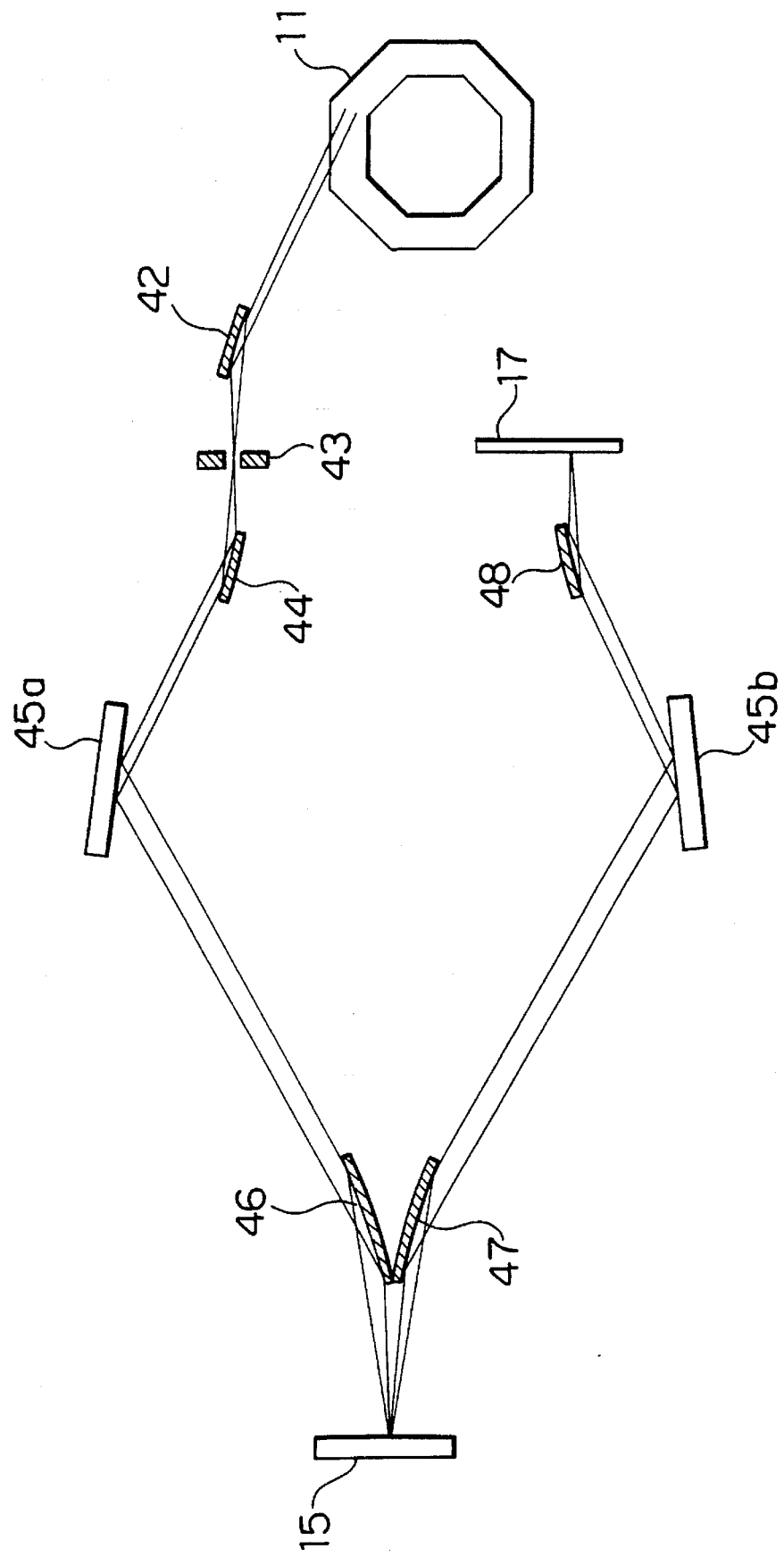

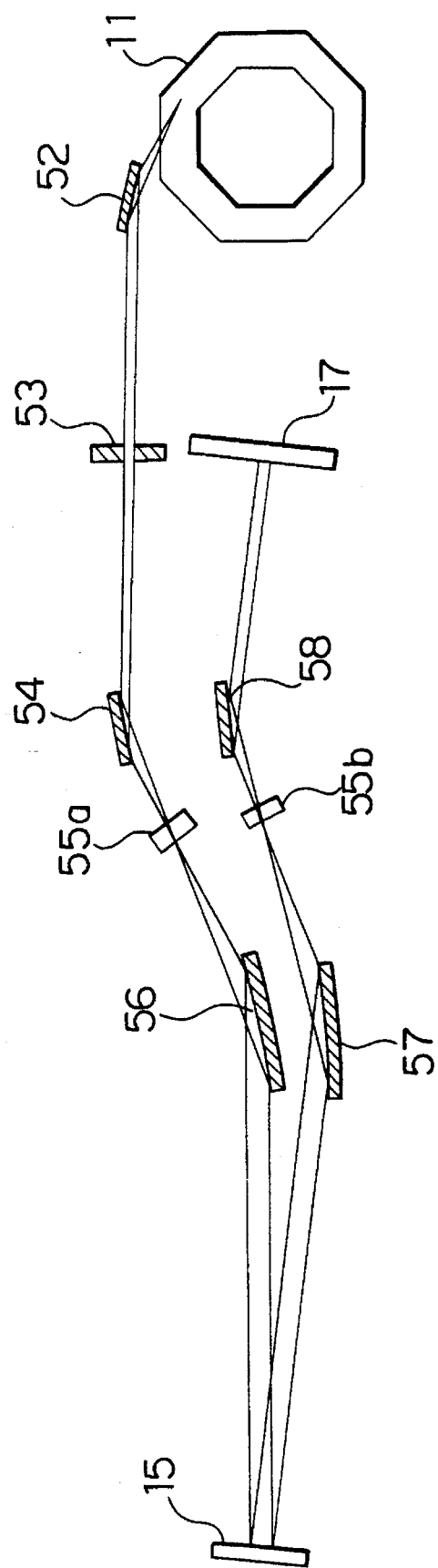

91

PROJECTION EXPOSURE APPARATUS

BACKGROUND OF THE INVENTION

1. Field of the Invention

This invention relates to a projection exposure apparatus for transferring fine patterns onto a wafer and, more particularly, to a projection exposure apparatus which transfers fine patterns by using a beam in the range from the X-ray region to the vacuum ultraviolet region.

2. Description of the Related Art

Recently, with the development of semiconductor devices having higher packaging densities, there is a demand for projection exposure apparatuses having higher resolutions to transfer finer circuit patterns. Generally, as is well known, the resolution of a projection exposure apparatus is higher if the numerical aperture of the projection optical system is larger or if the wavelength of illumination light is shorter. However, if the numerical aperture is increased, large-incident-angle components in illumination light incident upon a wafer are increased and, accordingly, the depth of focus is reduced, resulting a deterioration in pattern transfer accuracy.

For this reason, many trials have been made to improve the resolution of projection exposure apparatuses by using as illumination light a beam of short-wavelength rays such as X rays. However, if the wavelength of a beam is reduced, the beam can be absorbed in a material more easily. For example, it is difficult to use an image optical system using transmission lenses with respect to a beam in the range from the X-ray region to the vacuum ultraviolet region as in the case of conventional exposure apparatuses using a mercury lamp or the like as a light source. It is necessary to use a reflection type imaging optical system in such a case. For example, Japanese Patent Laid-Open Nos. 63-18626 and 63-312638 disclose reflection type imaging optical systems for transferring mask patterns onto a water by using X-rays.

Conventionally, however, synchrotron radiation light used as an illumination beam is treated substantially as a point light source. Therefore, the spatial coherence is increased. As a result, if fine complicated patterns formed on a mask are transferred, a deterioration occurs in a projected image due to the influence of interference between adjacent patterns.

SUMMARY OF THE INVENTION

In view of the above-described problems, an object of the present invention is to provide a projection exposure apparatus capable of accurately transferring fine patterns by using a beam in the range from the X-ray region to the vacuum ultraviolet region.

To achieve this object, according to one aspect of the present invention, there is provided a projection exposure apparatus comprising a beam source for emitting a beam in the range from an X-ray region to a vacuum ultraviolet region, a reflection type mask on which a circuit pattern are formed, an illumination optical system which forms a secondary light source surface by the beam emitted from the beam source and which irradiates the reflection type mask with the beam from the secondary light source surface, and a projection optical system which projects the circuit pattern on a wafer by converging the reflected beam from the reflection type mask on the wafer.

According to another aspect of the present invention, there is provided a projection exposure apparatus comprising a beam source for emitting a beam in the range from an X-ray region to a vacuum ultraviolet region, a reflection type mask on which a circuit pattern is formed, an illumination optical system which irradiates the reflection type mask with the beam emitted from the beam source, and a projection optical system which forms a pupil surface by the reflected beam from the reflection type mask, and which projects the circuit pattern on a wafer by converging the beam from the pupil surface on the wafer.

BRIEF DESCRIPTION OF THE DRAWINGS

FIGS. 6 and 7 are diagrams of projection exposure apparatuses in accordance with Embodiments 4 and 5, respectively;

FIGS. 9 and 10 are diagrams of projection exposure apparatuses in accordance with Embodiments 6 and 7, respectively;

FIGS. 15 and 16 are diagrams of projection exposure apparatuses in accordance with Embodiments 10 and 11, respectively;

DESCRIPTION OF THE PREFERRED EMBODIMENTS

The preferred embodiments of the present invention will be described below with reference to the accompanying drawings.

(Embodiment 1)

Figure 1:
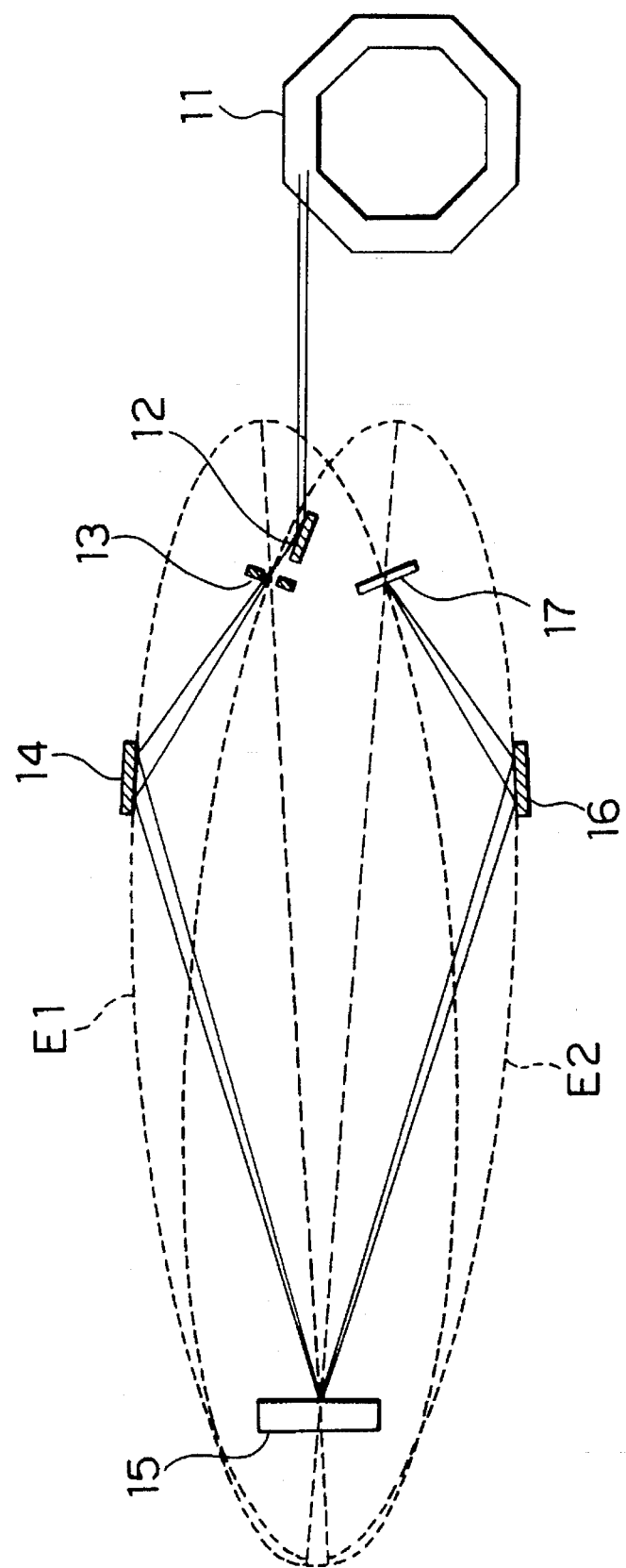
FIG. 1 is a diagram of a projection exposure apparatus in accordance with Embodiment 1 of the present invention.

FIG. 1 shows a projection exposure apparatus in accordance with Embodiment 1 of the present invention. A reflection type mask 15 is disposed in front of a beam source 11 with a mirror 12, a blind 13 and a mirror 14 interposed therebetween. A mirror 16 is disposed so as to receive a reflected beam from the reflection type mask 15, and a wafer 17 is disposed so as to receive a reflected beam from the mirror 16. Circuit patterns to be transferred onto the wafer 17 are drawn on the reflection type mask 15.

Figure 2A:
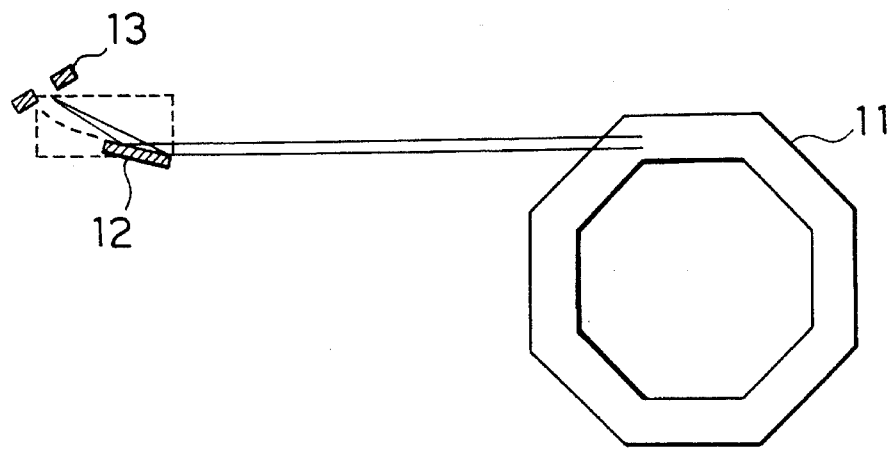
FIGS. 2a to 2c are diagrams of a light source optical system, an illumination optical system and a projection optical system, respectively, of Embodiment 1.

As beam source 11, a storage ring or an acceleration ring of an electron accelerator is used, and synchrotron radiation light emitted therefrom is used as exposure light. As illustrated in FIG. 2a, the mirror 12 is a parabolic mirror and is arranged to focus a beam from the beam source 11 on a blind surface of the blind 13.

Figure 2B:
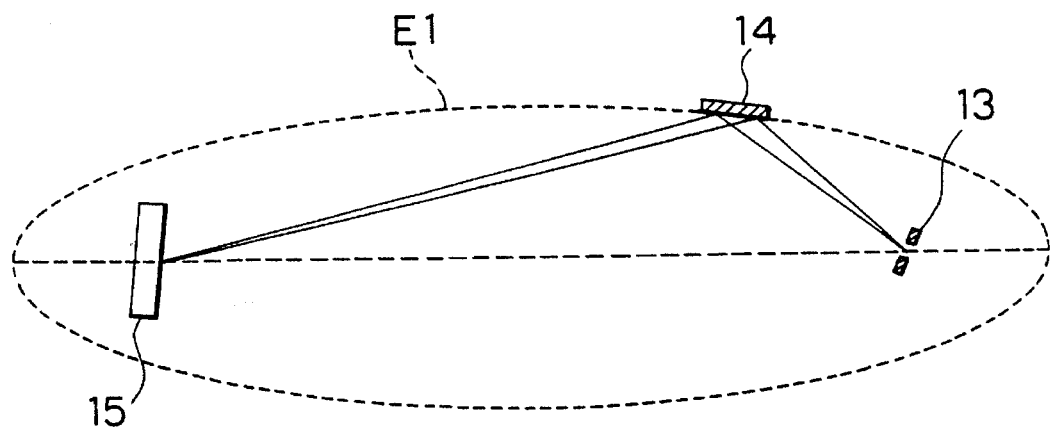
Figure 2C:
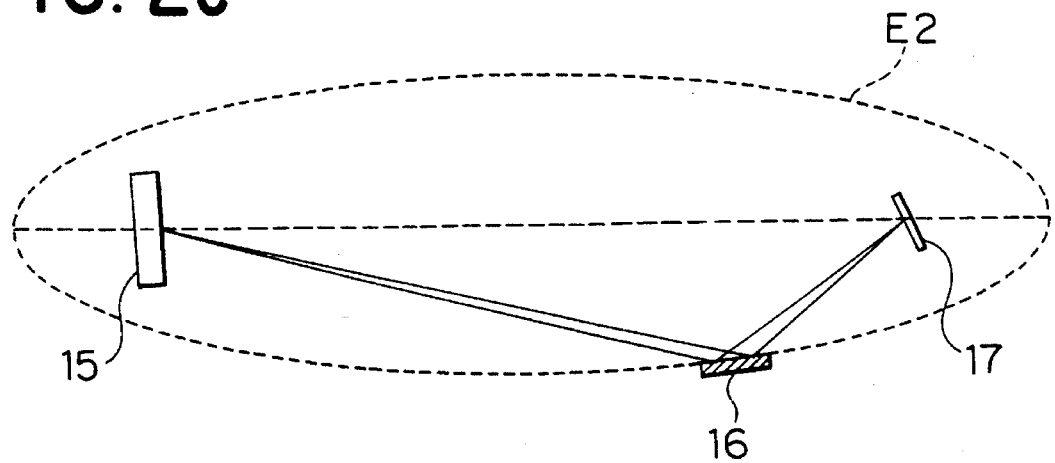

The mirror 14 is an ellipsoidal mirror, as illustrated in FIG. 2b, and is arranged to have a focal point on the blind surface of the blind 13 and another focal point on the mask 15. That is, the mirror 14 is disposed on an ellipse E1 which has focal points at positions on the blind 13 and the mask 15. The mirrors 12 and 14 form an illumination optical system and form a secondary light source surface at a position on the mirror 14. The mirror 14 also serves as a first spatial filter. As illustrated in FIG. 2c, the mirror 16 is an ellipsoidal mirror and is arranged to have a focal point on the mask 15 and another focal point on the wafer 17. That is, the mirror 16 is disposed on an ellipse E2 which has focal points at positions on the mask 15 and the wafer 17. A pupil surface corresponding to the secondary light source surface is formed at a position on the mirror 16. The mirror 16 forms a projection optical system and also serves as a secondary spatial filter.

Synchrotron radiation light emitted from the beam source 11 travels to the reflection type mask 15 via the mirror 12, the blind 13 and the mirror 14. The reflected beam from the mask 15 reaches the wafer 17 via the mirror 16. Consequently, the circuit patterns drawn on the mask 15 are transferred onto the wafer 17. If the illuminated area on the mask 15 is small, the mask 15 and the wafer 17 may be scanned in synchronization with each other according to the magnification to transfer the entire patterns on the mask 15 to the wafer 17.

The positions at which the mirrors 14 and 16 are disposed on the ellipses E1 and E2 may be selected to change the magnification. Thus, an X-ray reduction projection exposure apparatus can be realized.

The apparatus of this embodiment has the advantage of improved maintenance facility because the illumination optical system and the projection optical system are separate from each other.

(Embodiment 2)

Figure 3:
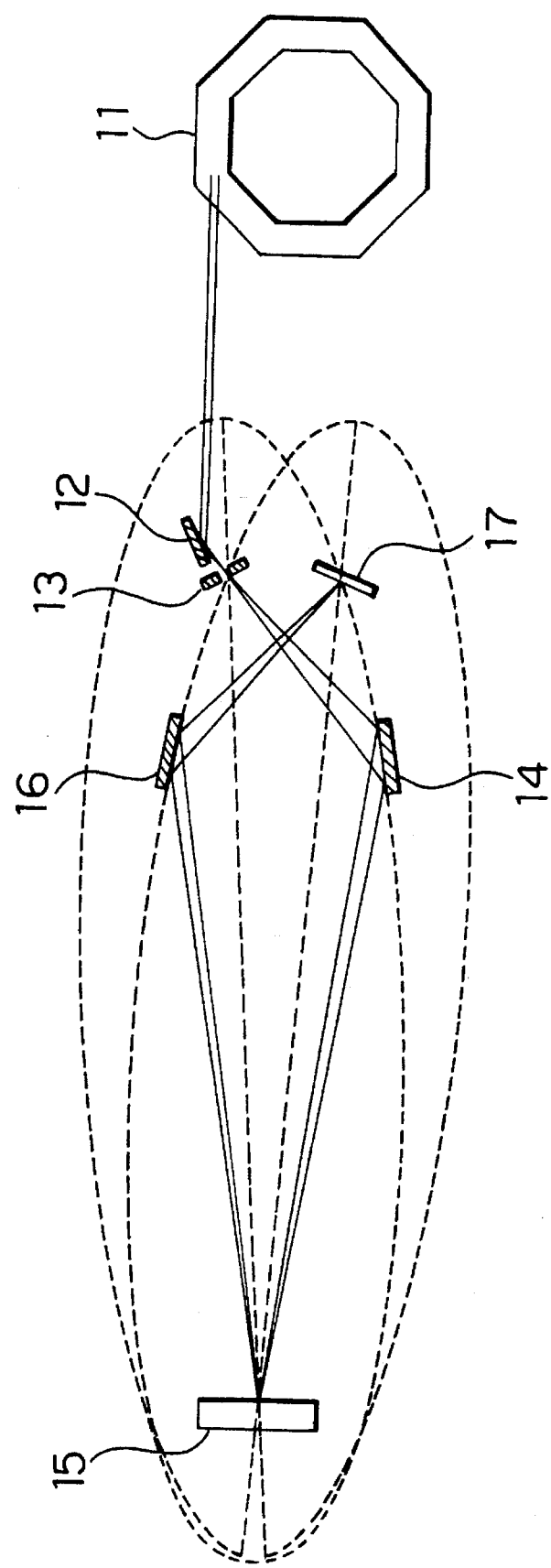
FIGS. 3 and 4 are diagrams of projection exposure apparatuses in accordance with Embodiments 2 and 3, respectively.

FIG. 3 shows a projection exposure apparatus in accordance with Embodiment 2 of the present invention. This apparatus is arranged in such a manner that, in the apparatus of Embodiment 1, the illumination optical system and the projection optical system are arranged so that their optical paths intersect each other, thereby reducing the space occupied by the entire apparatus. It is therefore possible to construct a smaller projection exposure apparatus. It is preferable to first adopt the arrangement of Embodiment 1 in a development process and to adopt the arrangement of Embodiment 2 when satisfactory results are accumulated.

(Embodiment 3)

Figure 4:
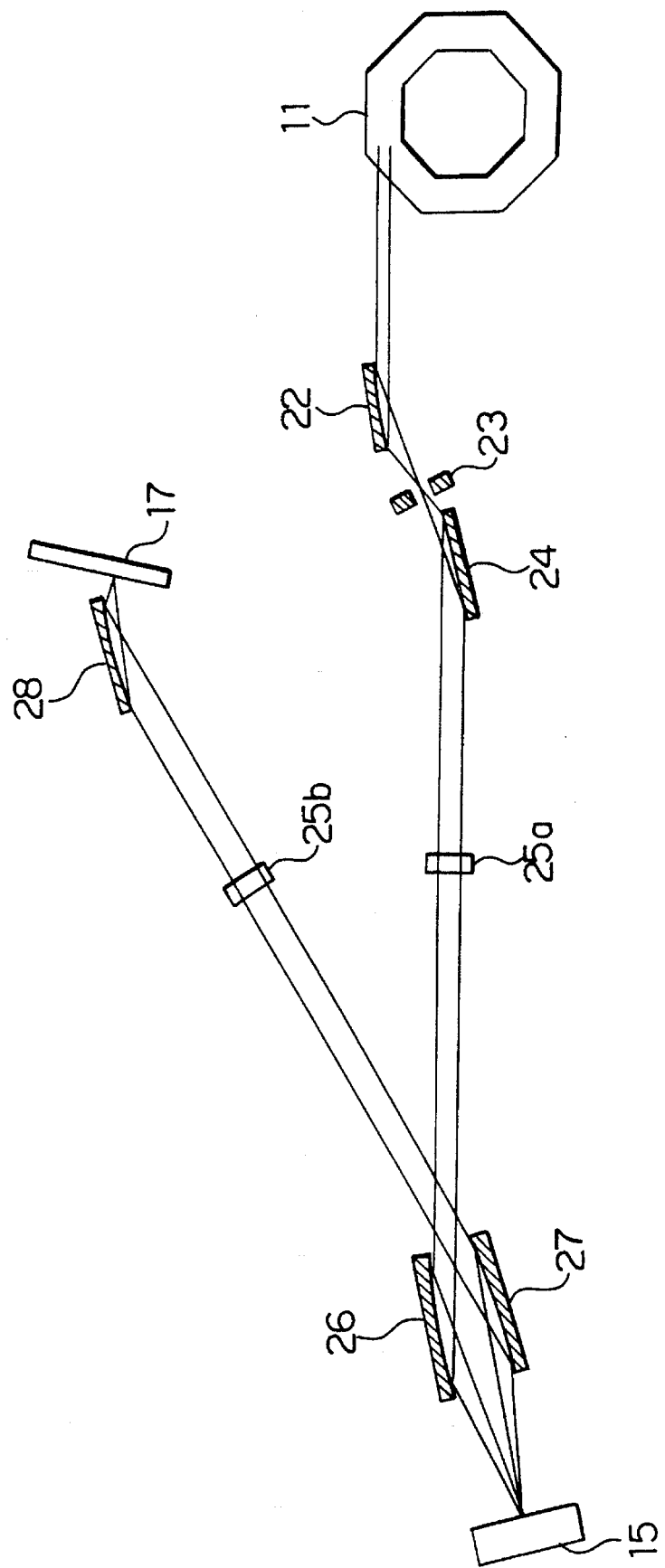

FIG. 4 shows a projection exposure apparatus in accordance with Embodiment 3 of the present invention. A first absorption type spatial filter 25a is disposed in front of a beam source 11 with a mirror 22, a blind 23 and a mirror 24 interposed therebetween. A reflection type mask 15 is disposed in front of the spatial filter 25a with a mirror 26 interposed therebetween. A mirror 27 is disposed so as to receive a reflected beam from the reflection type mask 15. A wafer 17 is disposed in front of the mirror 27 with a second absorption type spatial filter 25b and a mirror 28 interposed therebetween.

Figure 5A:
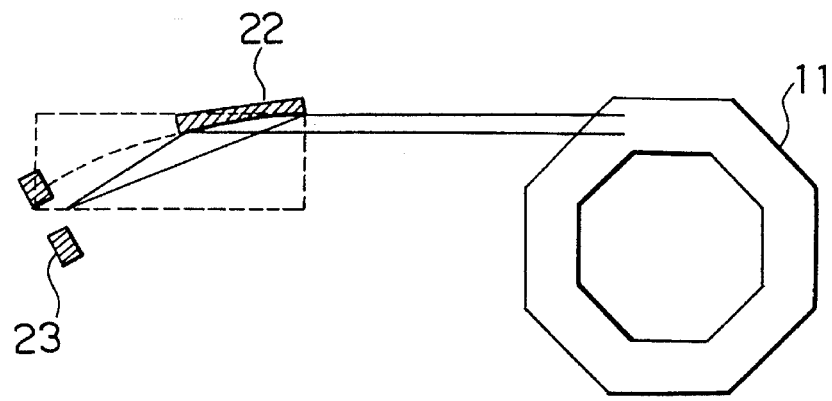
FIGS. 5a to 5c are diagrams of a light source optical system, an illumination optical system and a projection optical system, respectively, of Embodiment 3.

As illustrated in FIG. 5a, the mirror 22 is a parabolic mirror and is arranged to focus a beam from the beam source 11 on a blind surface of the blind 23.

Figure 5B:
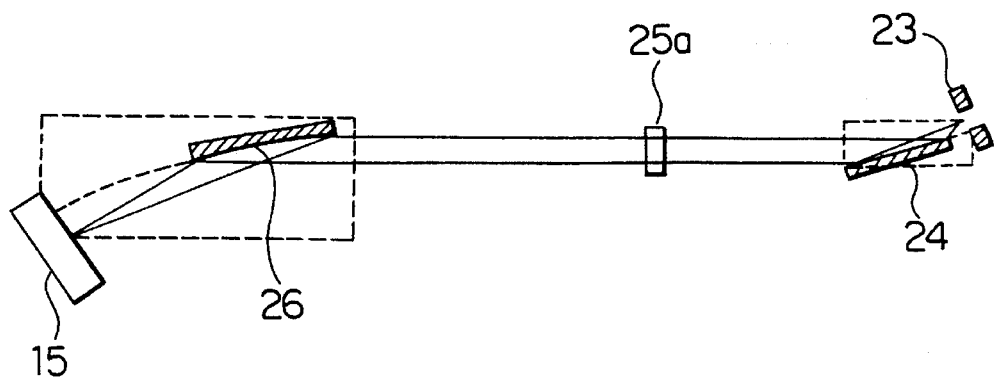
Figure 5C:
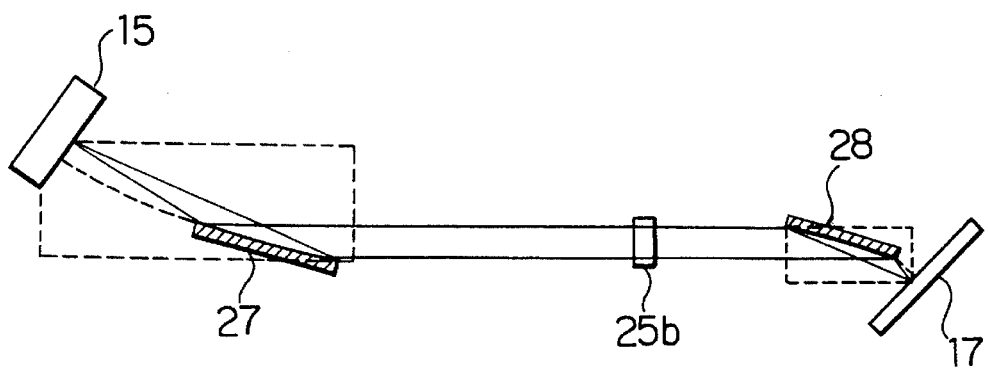

As illustrated in FIG. 5b, the mirrors 24 and 26 are parabolic mirrors and are arranged to have a focal point on the blind surface of the blind 23 and a focal point on the mask 15, respectively. The mirrors 22, 24, and 26 and the blind 23 form an illumination optical system, and also form a secondary light source surface at a position in the first spatial filter 25a. As illustrated in FIG. 5c, the mirrors 27 and 28 are parabolic mirrors and are arranged to have focal points on the mask 15 and the wafer 17, respectively. The mirrors 27 and 28 form a projection optical system, and also form a pupil surface corresponding to the secondary light source surface at a position in the second spatial filter 25b.

Synchrotron radiation light emitted from the beam source 11 travels to the first spatial filter 25a via the mirror 22, the blind 23 and the mirror 24. After passing through the first spatial filter 25a, the beam travels to the reflection type mask 15 via the mirror 26. The reflected beam from the mask 15 travels to the second spatial filter 25b via the mirror 27. After passing through the second spatial filter 25b, the beam reaches the wafer 17 via the mirror 28.

The curvatures and the disposed positions of the mirrors 24 and 26 may be selected to change the magnification. Also, the curvatures and the disposed positions of the mirrors 27 and 28 may be selected to change the magnification.

The apparatus of Embodiment 3 is advantageous in that the space occupied by the entire apparatus can be reduced because the illumination optical system and the projection optical system are formed so as to intersect each other.

(Embodiment 4)

FIG. 6 shows a projection exposure apparatus in accordance with Embodiment 4 of the present invention. This apparatus is arranged in such a manner that, in the projection exposure apparatus of Embodiment 3. the illumination optical system and the projection optical system are disposed separately from each other, thereby improving maintenance facility.

(Embodiment 5)

Figure 7:
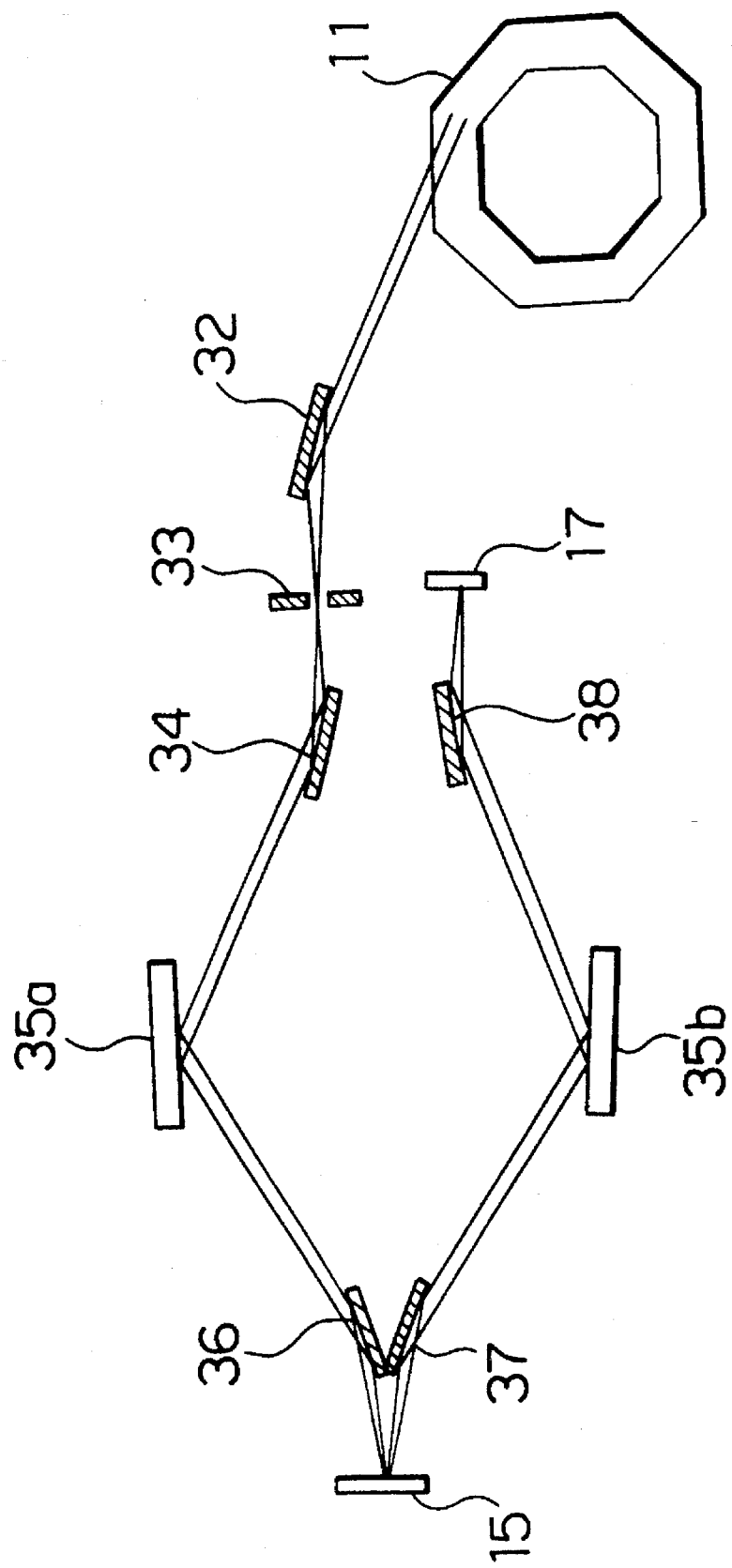

FIG. 7 shows a projection exposure apparatus in accordance with Embodiment 5 of the present invention. A first reflection type spatial filter 35a is disposed in front of a beam source 11 with a mirror 32, a blind 33 and a mirror 34 interposed therebetween. A reflection type mask 15 is disposed in front of the spatial filter 35a with a mirror 36 interposed therebetween. A mirror 37 is disposed so as to receive a reflected beam from the reflection type mask 15. A wafer 17 is disposed in front of the mirror 37 with a second reflection type spatial filter 35b and a mirror 38 interposed therebetween.

Figure 8A:
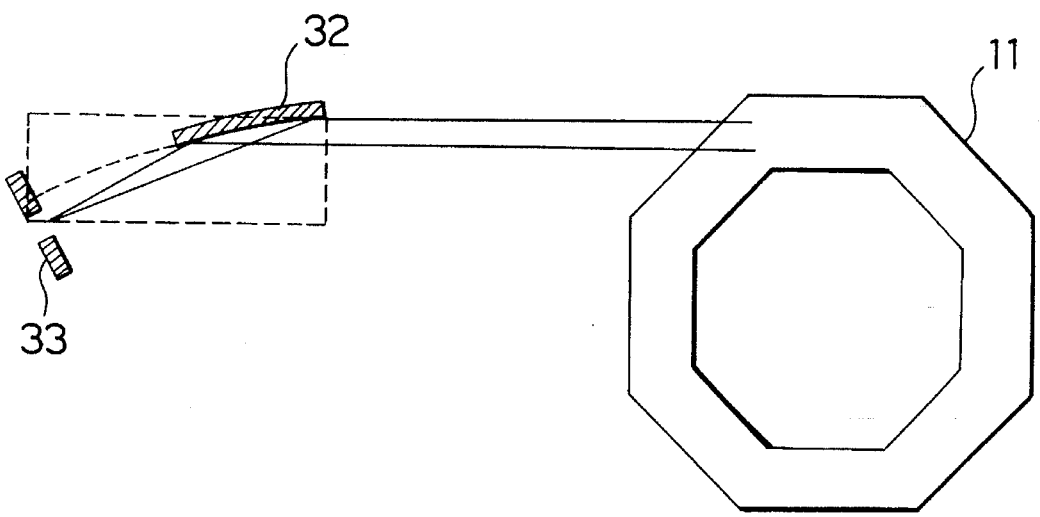
FIGS. 8a to 8c are diagrams of a light source optical system, an illumination optical system and a projection optical system, respectively, of Embodiment 5.

As illustrated in FIG. 8a, the mirror 32 is a parabolic mirror and is arranged to focus a beam from the beam source 11 on a blind surface of the blind 33.

Figure 8B:
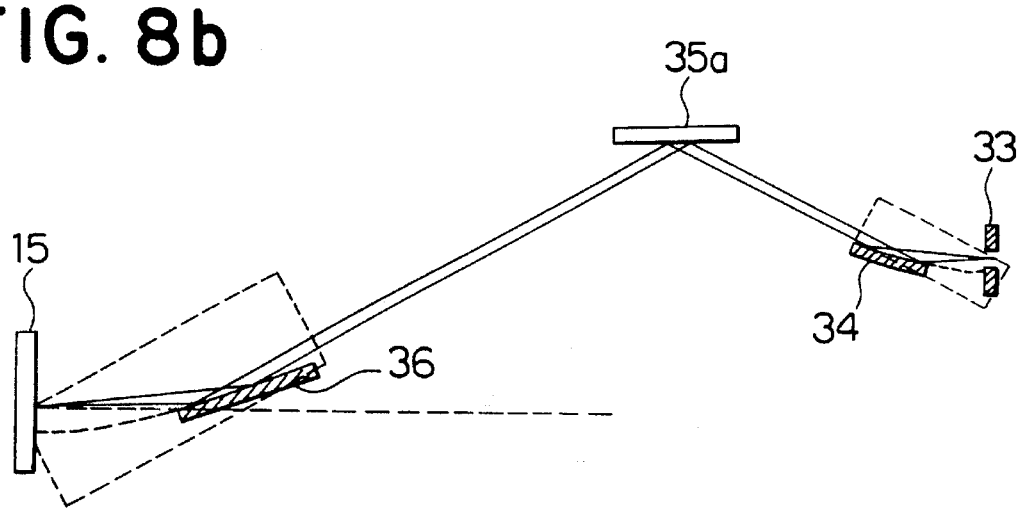
Figure 8C:
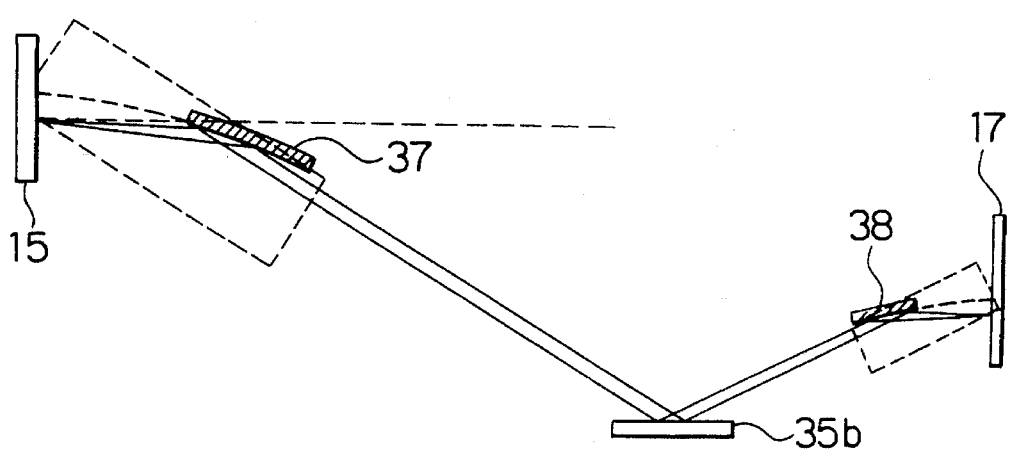

As illustrated in FIG. 8b, the mirrors 34 and 36 are parabolic mirrors and are arranged to have a focal point on the blind surface of the blind 33 and a focal point on the mask 15, respectively. The mirrors 32, 34, and 36 and the blind 33 form an illumination optical system, and also form a secondary light source surface at a position on the first spatial filter 35a. As illustrated in FIG. 8c, the mirrors 37 and 38 are parabolic mirrors and are arranged to have focal points on the mask 15 and the wafer 17, respectively. The mirrors 37 and 38 form a projection optical system, and also form a pupil surface corresponding to the secondary light source surface at a position on the second spatial filter 35b.

Synchrotron radiation light emitted from the beam source 11 travels to the first spatial filter 35a via the mirror 32, the blind 33 and the mirror 34. After being reflected by the first spatial filter 35a, the beam travels to the reflection type mask 15 via the mirror 36. The reflected beam from the mask 15 travels to the second spatial filter 35b via the mirror 37. After being reflected by the second spatial filter 35b, the beam reaches the wafer 17 via the mirror 38.

The curvatures and the disposed positions of the mirrors 34 and 36 may be selected to change the magnification. Also, the curvatures and the disposed positions of the mirrors 37 and 38 may be selected to change the magnification.

The apparatus of Embodiment 5 has the advantage of improved maintenance facility because the illumination optical system and the projection optical system are separate from each other.

(Embodiment 6)

Figure 9:
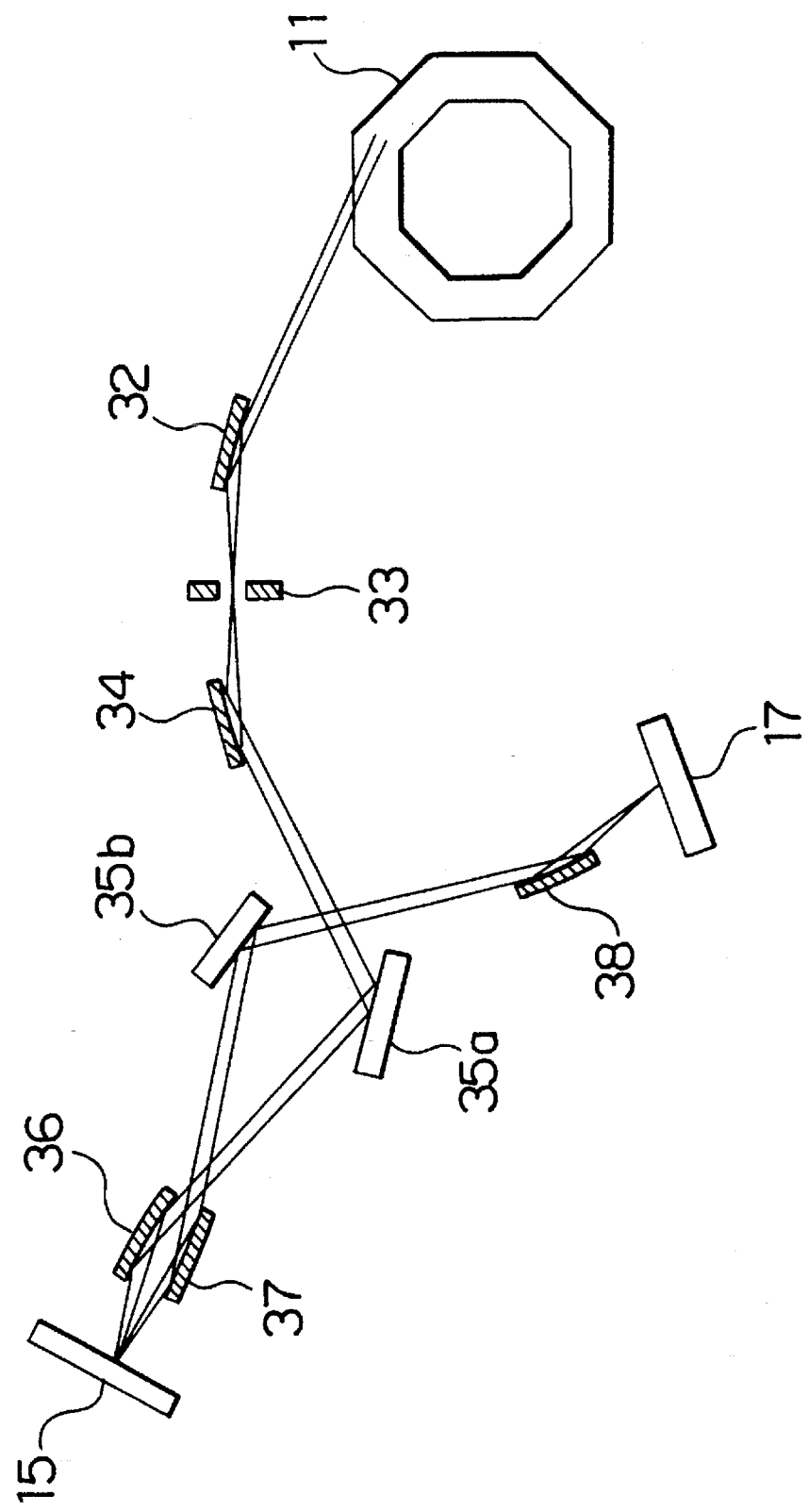

FIG. 9 shows a projection exposure apparatus in accordance with Embodiment 6 of the present invention. This apparatus is arranged in such a manner that, in the projection exposure apparatus of Embodiment 5, the illumination optical system and the projection optical system are arranged so that their optical paths intersect each other, thereby reducing the space occupied by the entire apparatus. As a result, a smaller projection exposure apparatus can be constructed.

(Embodiment 7)

FIG. 10 shows a projection exposure apparatus in accordance with Embodiment 7 of the present invention. A first reflection type spatial filter 45a is disposed in front of a beam source 11 with a mirror 42, a blind 43 and a mirror 44 interposed therebetween. A reflection type mask 15 is disposed in front of the spatial filter 45a with a mirror 46 interposed therebetween. A mirror 47 is disposed so as to receive a reflected beam from the reflection type mask 15. A wafer 17 is disposed in front of the mirror 47 with a second reflection type spatial filter 45b and a mirror 48 interposed therebetween.

Figure 11A:
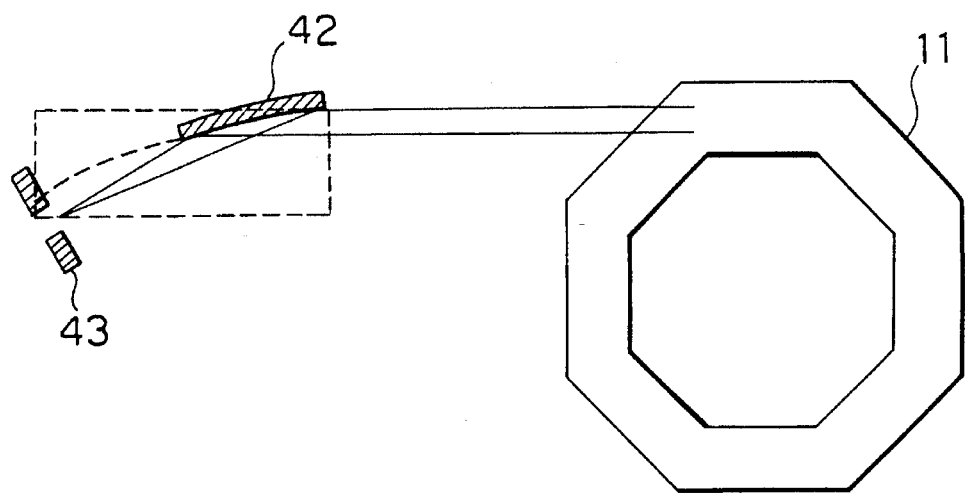
FIGS. 11a to 11c are diagrams of a light source optical system, an illumination optical system and a projection optical system, respectively, of Embodiment 7.

As illustrated in FIG. 11a, the mirror 42 is a parabolic mirror and is arranged to focus a beam from the beam source 11 on a blind surface of the blind 43.

Figure 11B:
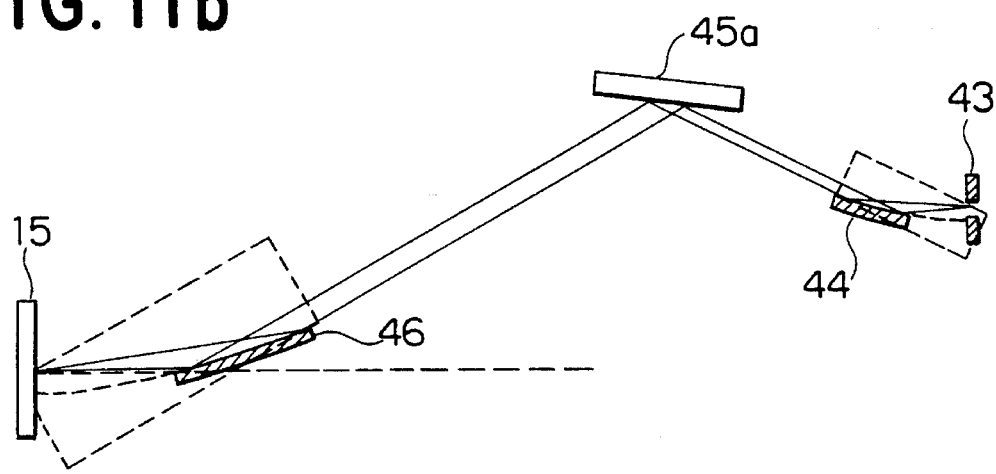
Figure 11C:
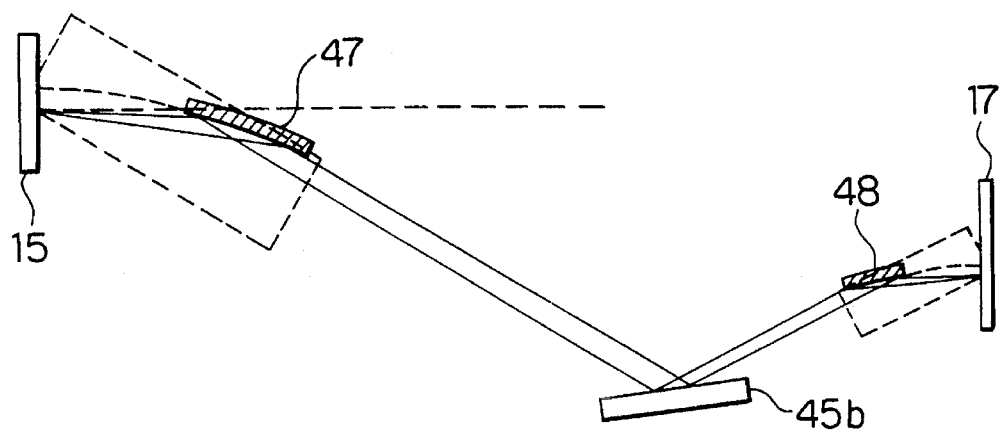

As illustrated in FIG. 11b, the mirrors 44 and 46 are parabolic mirrors and are arranged to have a focal point on the blind surface of the blind 43 and a focal point on the mask 15, respectively. The mirrors 42, 44, and 46 and the blind 43 form an illumination optical system, and also form a secondary light source surface at a position on the first spatial filter 45a. As illustrated in FIG. 11c, the mirrors 47 and 48 are parabolic mirrors and are arranged to have focal points on the mask 15 and the wafer 17, respectively. The mirrors 47 and 48 form a projection optical system, and also form a pupil surface corresponding to the secondary light source surface at a position on the second spatial filter 45b.

Each of the first and second spatial filters 45a and 45b is formed of a single crystal. For example, (111) plane of a face-centered cubic lattice single crystal of Si, GaAs or the like is exposed as an obverse surface to irradiate the mask with (100) diffracted light, i.e., reflected light from the surface. In this manner, asymmetric diffracted light is obtained, so that the magnification can be changed without an aberration.

Synchrotron radiation light emitted from the beam source 11 travels to the first spatial filter 45a via the mirror 42, the blind 43 and the mirror 44. After being reflected by the first spatial filter 45a, the beam travels to the reflection type mask 15 via the mirror 46. The reflected beam from the mask 15 travels to the second spatial filter 45b via the mirror 47. After being reflected by the second spatial filter 45b, the beam reaches the wafer 17 via the mirror 48.

The curvatures and the disposed positions of the mirrors 44 and 46 may be selected to change the magnification. Also, the curvatures and the disposed positions of the mirrors 47 and 48 may be selected to change the magnification.

The apparatus of Embodiment 7 has the advantage of improved maintenance facility because the illumination optical system and the projection optical system are separate from each other.

(Embodiment 8)

Figure 12:
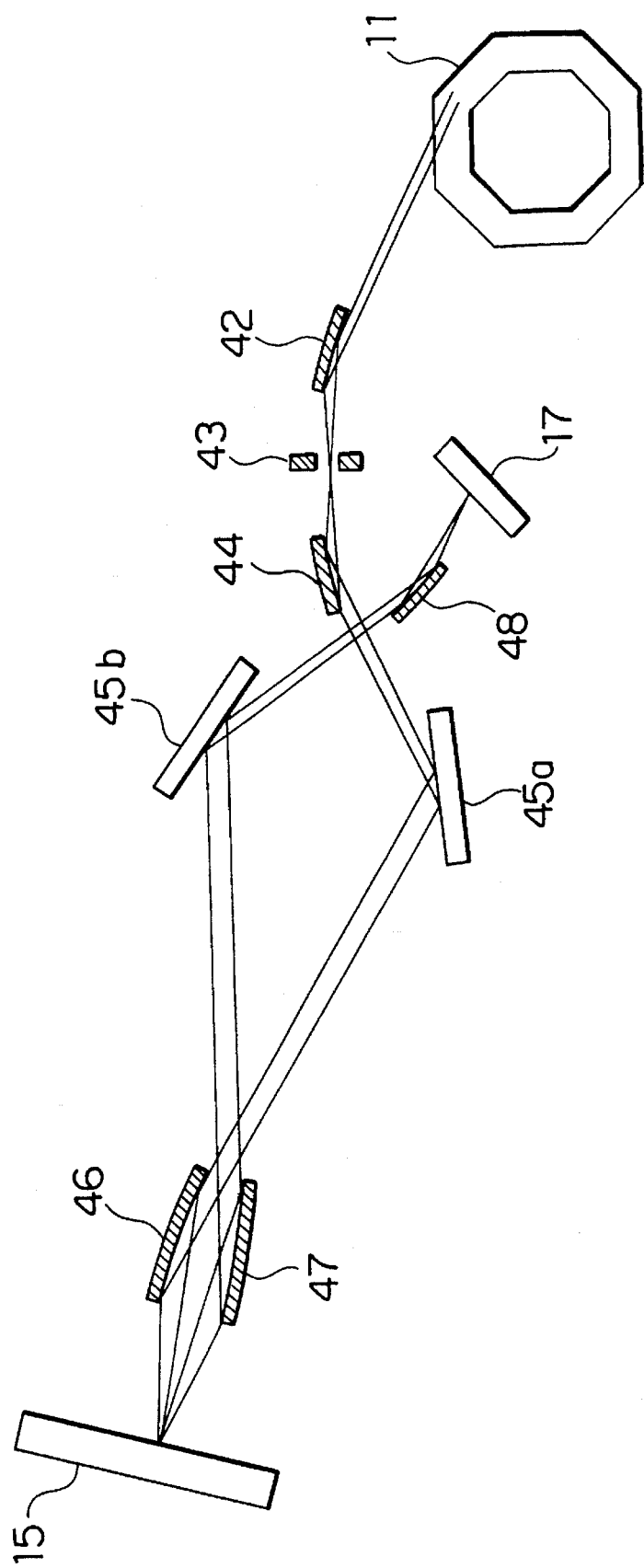
FIGS. 12 and 13 are diagrams of projection exposure apparatuses in accordance with Embodiments 8 and 9, respectively.

FIG. 12 shows a projection exposure apparatus in accordance with Embodiment 8 of the present invention. This apparatus is arranged in such a manner that, in the projection exposure apparatus of Embodiment 7, the illumination optical system and the projection optical system are arranged so that their optical paths intersect each other, thereby reducing the space occupied by the entire apparatus. As a result, a smaller projection exposure apparatus can be constructed.

(Embodiment 9)

Figure 13:
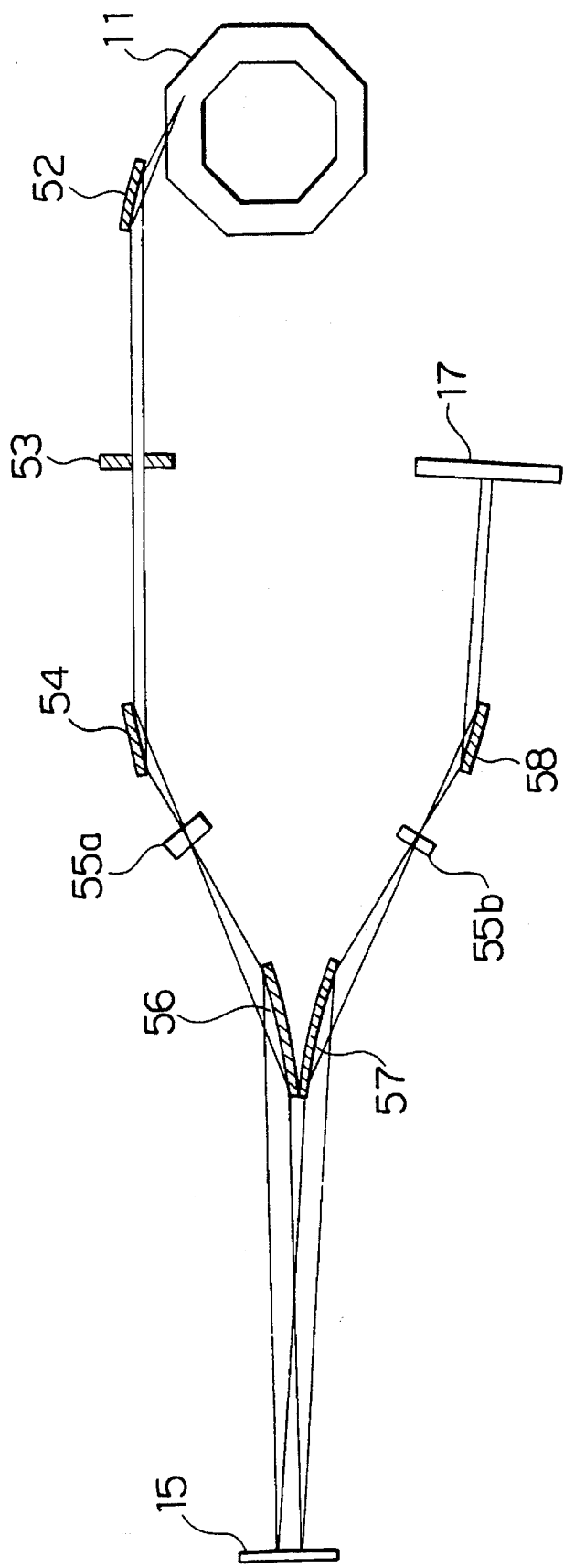

FIG. 13 shows a projection exposure apparatus in accordance with Embodiment 9 of the present invention. A first absorption type spatial filter 55a is disposed in front of a beam source 11 with a mirror 52, a blind 53 and a mirror 54 interposed therebetween. A reflection type mask 15 is disposed in front of the spatial filter 55a with a mirror 56 interposed therebetween. A mirror 57 is disposed so as to receive a reflected beam from the reflection type mask 15. A wafer 17 is disposed in front of the mirror 57 with a second absorption type spatial filter 55b and a mirror 58 interposed therebetween.

Figure 14A:
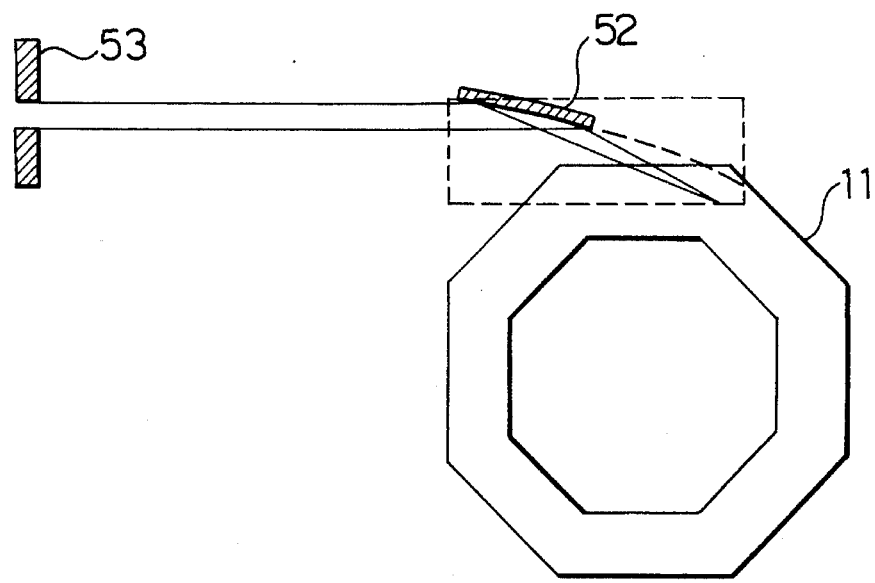
FIGS. 14a to 14c are diagrams of a light source optical system, an illumination optical system and a projection optical system, respectively, of Embodiment 9.

As illustrated in FIG. 14a, the mirror 52 is a parabolic mirror and is arranged to have a focal point on a bending magnet of an accelerator constituting the beam source 11.

Figure 14B:
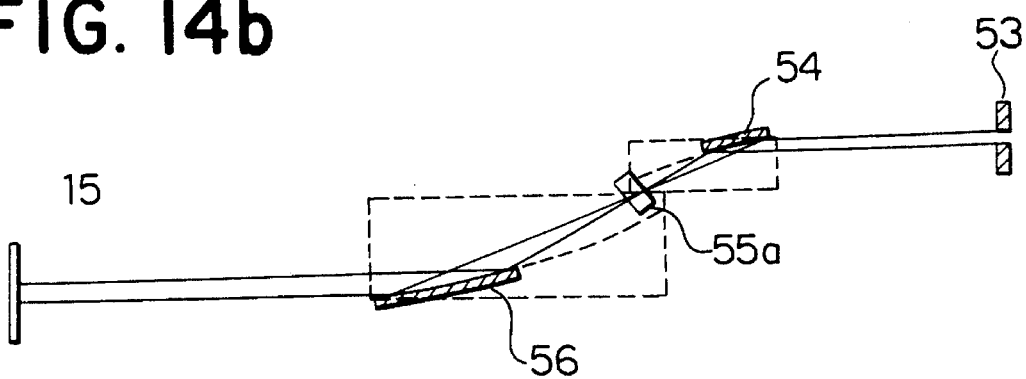
Figure 14C:
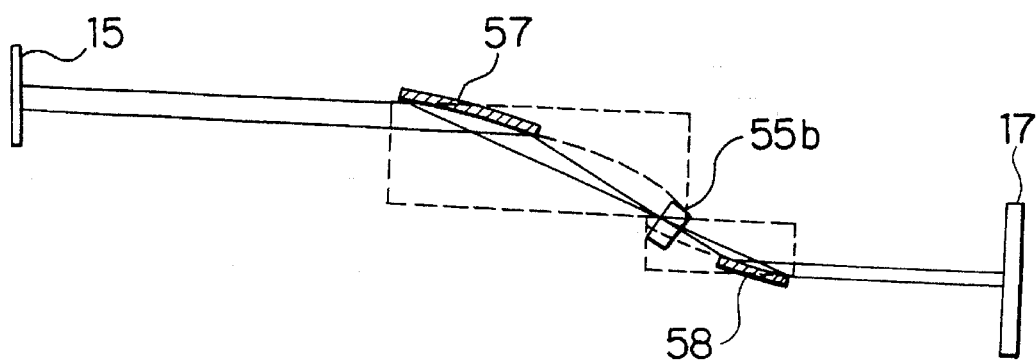

As illustrated in FIG. 14b, the mirrors 54 and 56 are parabolic mirrors and are arranged to have a focal point on a blind surface of the blind 53 and a focal point on the mask 15, respectively. The mirrors 52, 54, and 56 and the blind 53 form an illumination optical system, and also form a secondary light source surface at a position corresponding to the first spatial filter 55a. As illustrated in FIG. 14c, the mirrors 57 and 58 are parabolic mirrors and are arranged to have focal points on the mask 15 and the wafer 17, respectively. The mirrors 57 and 58 form a projection optical system, and also form a pupil surface corresponding to the secondary light source surface at a position on the second spatial filter 55b.

Synchrotron radiation light emitted from the beam source 11 travels to the first spatial filter 55a via the mirror 52, the blind 53 and the mirror 54. After passing through the first spatial filter 55a, the beam travels to the reflection type mask 15 via the mirror 56. The reflected beam from the mask 15 travels to the second spatial filter 55b via the mirror 57. After passing through the second spatial filter 55b, the beam reaches the wafer 17 via the mirror 58.

The curvatures and the disposed positions of the mirrors 54 and 56 may be selected to change the magnification. Also, the curvatures and the disposed positions of the mirrors 57 and 58 may be selected to change the magnification.

The apparatus of Embodiment 9 is arranged so that the mirror 52 has a focal point on the bending magnet of the accelerator constituting the beam source 11, thereby ensuring that the synchrotron radiation light can be emitted as a parallel beam to be incident upon the blind 53 even if the distance between the beam source 11 and the blind 53 or the like is short. The apparatus of Embodiment 9 also has the advantage of improved maintenance facility because the illumination optical system and the projection optical system are opposed to each other.

(Embodiment 10)

FIG. 15 shows a projection exposure apparatus in accordance with Embodiment 10 of the present invention. This apparatus is arranged in such a manner that, in the projection exposure apparatus of Embodiment 9, the illumination optical system and the projection optical system are formed generally in parallel with each other, thereby reducing the space occupied by the entire apparatus.

(Embodiment 11)

Figure 16:
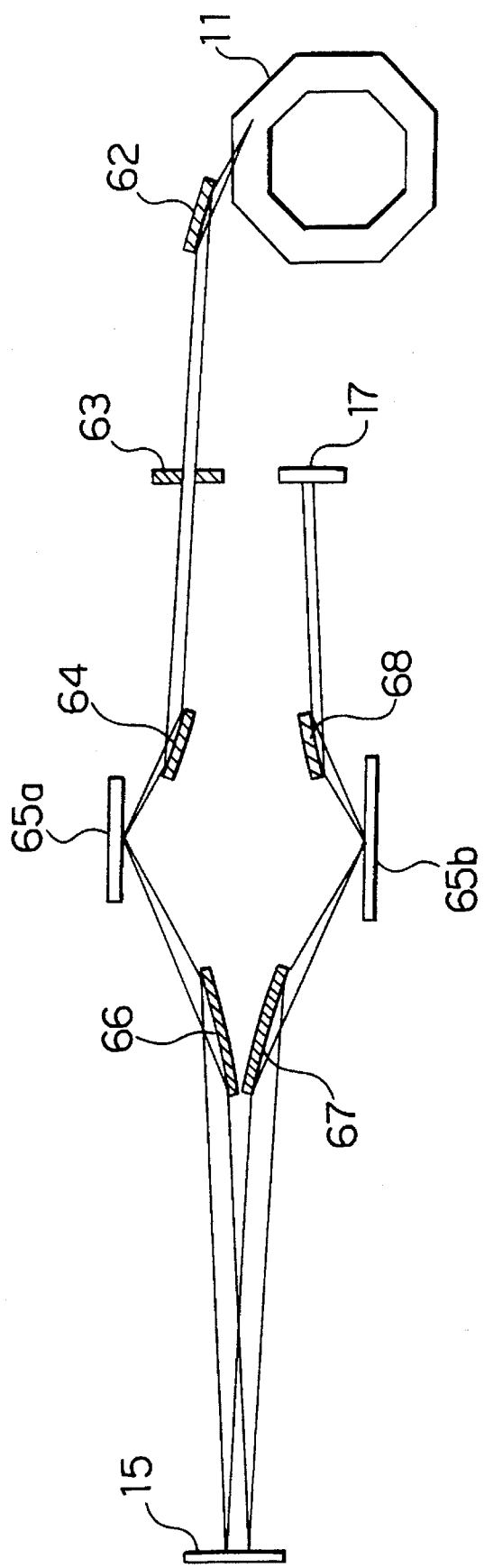

FIG. 16 shows a projection exposure apparatus in accordance with Embodiment 11 of the present invention. A first reflection type spatial filter 65a is disposed in front of a beam source 11 with a mirror 62, a blind 63 and a mirror 64 interposed therebetween. A reflection type mask 15 is disposed in front of the spatial filter 65a with a mirror 66 interposed therebetween. A mirror 67 is disposed so as to receive a reflected beam from the reflection type mask 15. A wafer 17 is disposed in front of the mirror 67 with a second reflection type spatial filter 65b and a mirror 68 interposed therebetween.

Figure 17A:
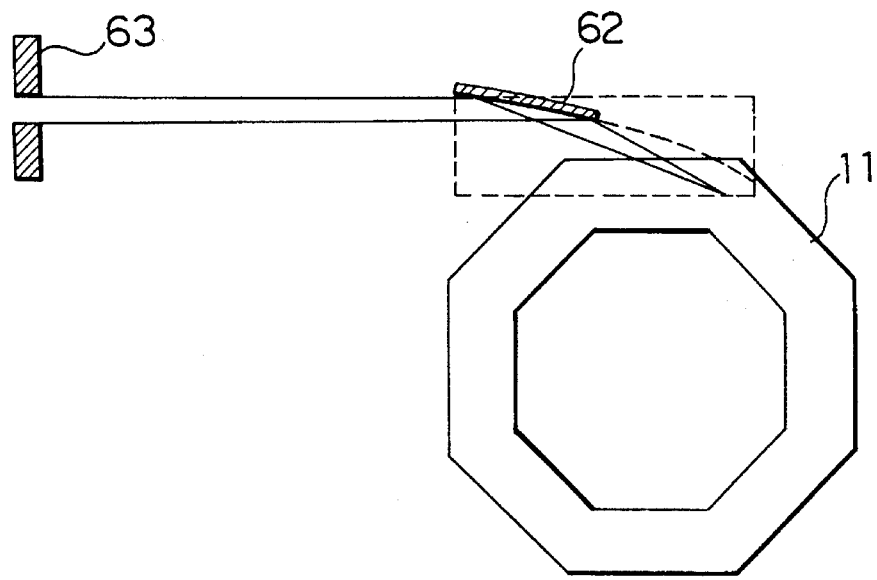
FIGS. 17a to 17c are diagrams of a light source optical system, an illumination optical system and a projection optical system, respectively, of Embodiment 11.

As illustrated in FIG. 17a, the mirror 62 is a parabolic mirror and is arranged to have a focal point on a bending magnet of an accelerator constituting the beam source 11.

Figure 17B:
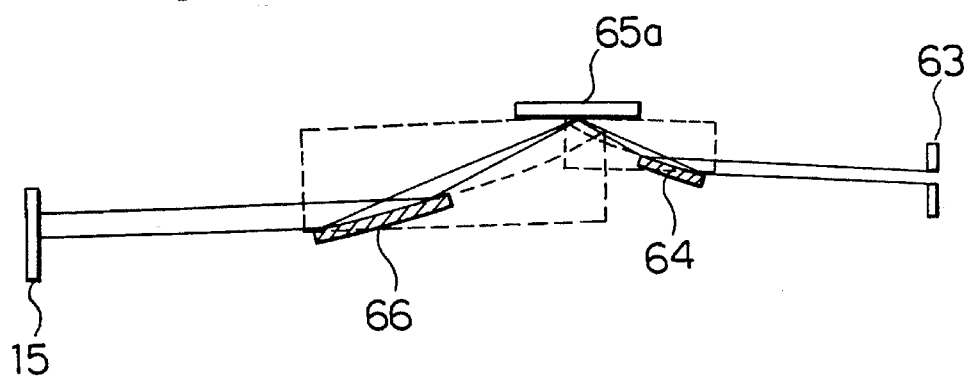
Figure 17C:
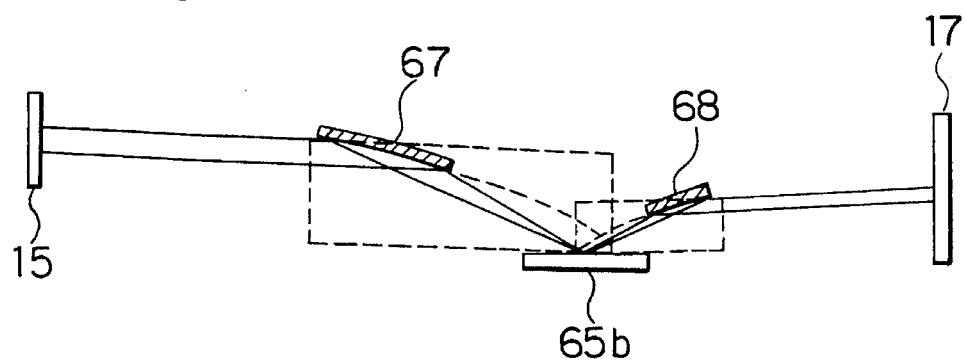

As illustrated in FIG. 17b, the mirrors 64 and 66 are parabolic mirrors and are arranged to have a focal point on a blind surface of the blind 63 and a focal point on the mask 15, respectively. The mirrors 62, 64, and 66 and the blind 63 form an illumination optical system, and also form a secondary light source surface at a position on the first spatial filter 65a. As illustrated in FIG. 17c, the mirrors 7 and 68 are parabolic mirrors and are arranged to have focal points on the mask 15 and the wafer 17, respectively. The mirrors 67 and 68 form a projection optical system, and also form a pupil surface corresponding to the secondary light source surface at a position on the second spatial filter 65b.

Synchrotron radiation light emitted from the beam source 11 travels to the first spatial filter 65a via the mirror 62, the blind 63 and the mirror 64. After being reflected by the first spatial filter 65a, the beam travels to the reflection type mask 15 via the mirror 66. The reflected beam from the mask 15 travels to the second spatial filter 65b via the mirror 67. After being reflected by the second spatial filter 65b, the beam reaches the wafer 17 via the mirror 68.

The curvatures and the disposed positions of the mirrors 64 and 66 may be selected to change the magnification. Also, the curvatures and the disposed positions of the mirrors 67 and 68 may be selected to change the magnification.

The apparatus of Embodiment 11 is arranged so that the mirror 62 has a focal point on the bending magnet of the accelerator constituting the beam source 11, thereby ensuring that the synchrotron radiation light can be emitted as a parallel beam to be incident upon the blind 63 even if the distance between the beam source 11 and the blind 63 or the like is short. The apparatus of Embodiment 11 also has the advantage of improved maintenance facility because the illumination optical system and the projection optical system are opposed to each other.

(Embodiment 12)

Figure 18:
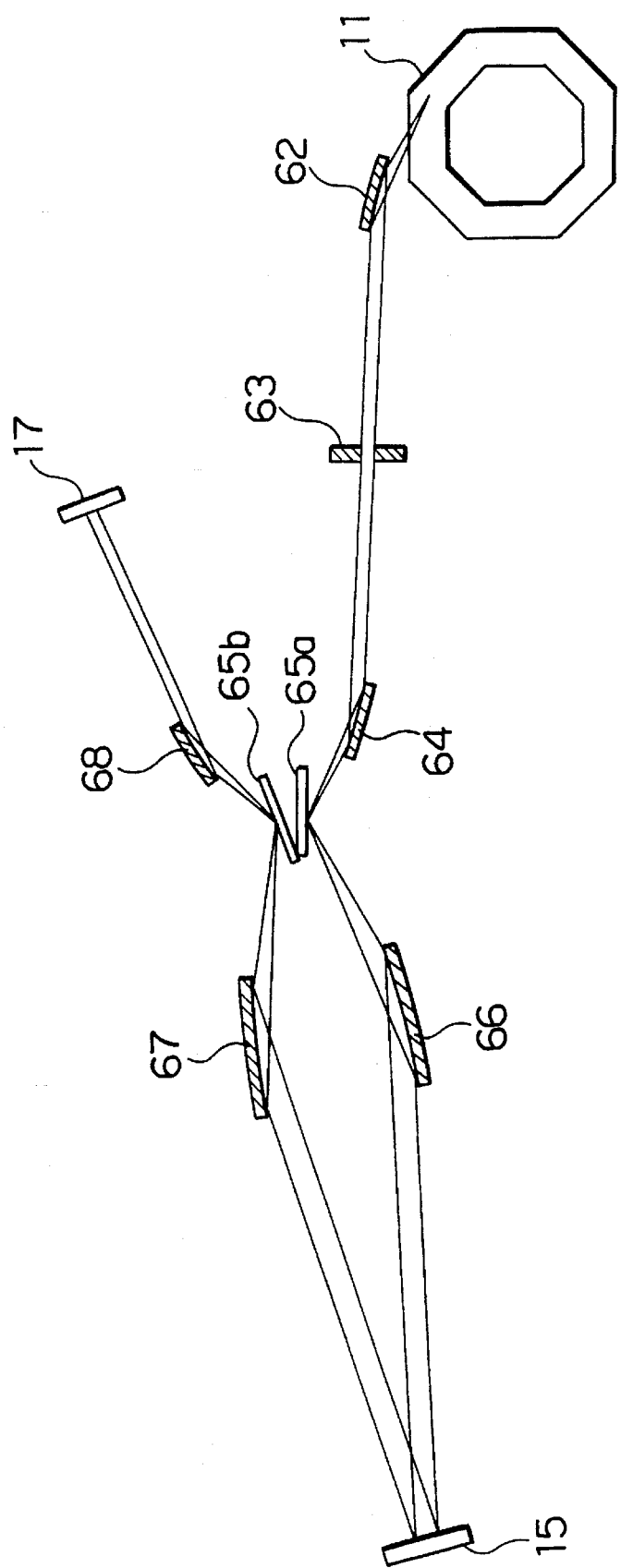
FIG. 18 is a diagram of a projection exposure apparatus in accordance with Embodiment 12.

FIG. 18 shows a projection exposure apparatus in accordance with Embodiment 12 of the present invention. This apparatus is arranged in such a manner that, in the projection exposure apparatus of Embodiment 11, the illumination optical system and the projection optical system are formed generally in parallel with each other, thereby reducing the space occupied by the entire apparatus.

(Embodiment 13)

The secondary light source surface of the illumination optical system is at an incidence pupil position as viewed from the mask 15. Accordingly, the first spatial filter disposed on the secondary light source surface functions as a modified illumination filter. Improvements in imaging characteristics achieved by using modified illumination filters are disclosed in JJAP, Vol. 30 (1991), pp3021–3029 and JJAP, Vol. 32 (1991), pp239–243.

Figure 19A:
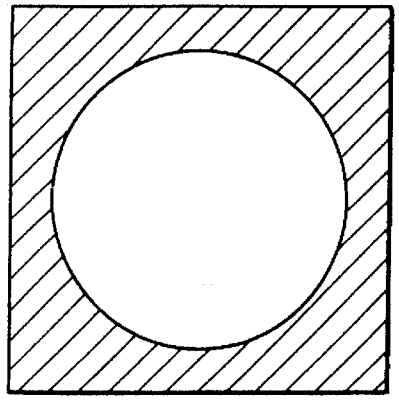
FIGS. 19a to 19d are diagrams of first spatial filters used in Embodiments 13 to 16, respectively.

A circular reflecting plate such as that shown in FIG. 19a may be used as the mirror 14 forming the first spatial filter of Embodiments 1 and 2, the first spatial filter 35a or 45a of Embodiments 5 to 8, or the first spatial filter 65a of Embodiments 11 and 12 to form a secondary light source surface in accordance with the ordinary illumination method. Similarly, a circular aperture filter may be used as the first spatial filter 25a of Embodiments 3 and 4 or the first spatial filter 55a of Embodiments 9 and 10 to form a secondary light source surface in accordance with the ordinary illumination method.

(Embodiment 14)

Figure 19B:
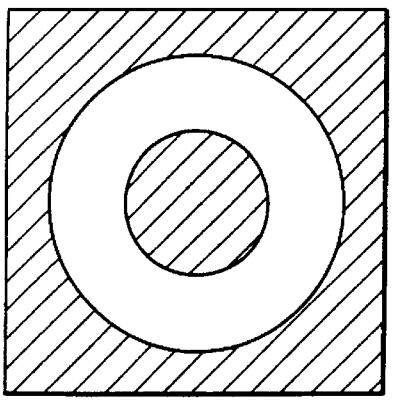

An annular-band reflecting plate such as that shown in FIG. 19b may be used as the mirror 14 forming the first spatial filter of Embodiments 1 and 2, the first spatial filter. 35a or 45a of Embodiments 5 to 8, or the first spatial filter 65a of Embodiments 11 and 12 to form a secondary light source surface in accordance with an annular-band illumination method. Similarly, an annular-band-aperture filter may be used as the first spatial filter 25a of Embodiments 3 and 4 or the first spatial filter 55a of Embodiments 9 and 10 to form a secondary light source surface in accordance with an annular-band illumination method.

(Embodiment 15)

Figure 19C:
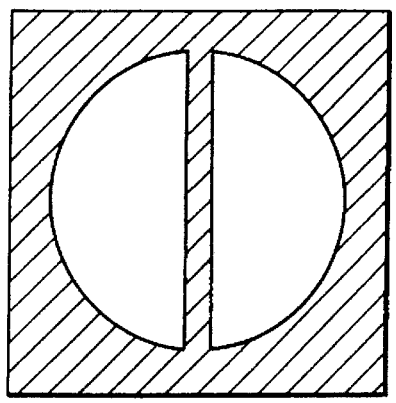

A two-split reflecting plate such as that shown in FIG. 19c may be used as the mirror 14 forming the first spatial filter of Embodiments 1 and 2, the first spatial filter 35a or 45a of Embodiments 5 to 8, or the first spatial filter 65a of Embodiments 11 and 12 to form a secondary light source surface in accordance with a two-split illumination method. Similarly, a two-split-aperture filter may be used as the first spatial filter 25a of Embodiments 3 and 4 or the first spatial filter 55a of Embodiments 9 and 10 to form a secondary light source surface in accordance with a two-split illumination method.

(Embodiment 16)

Figure 19D:
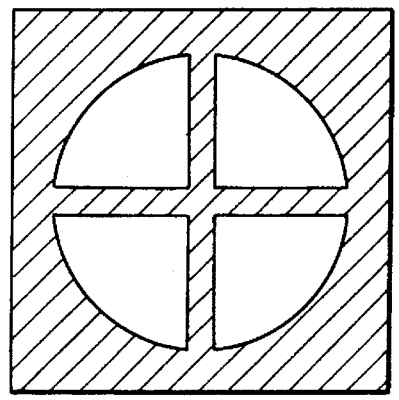

A four-split reflecting plate such as that shown in FIG. 19d may be used as the mirror 14 forming the first spatial filter of Embodiments 1 and 2, the first spatial filter. 35a or 45a of Embodiments 5 to 8, or the first spatial filter 65a of Embodiments 11 and 12 to form a secondary light source surface in accordance with a four-split illumination method. Similarly, a four-split-aperture filter may be used as the first spatial filter 25a of Embodiments 3 and 4 or the first spatial filter 55a of Embodiments 9 and 10 to form a secondary light source surface in accordance with a four-split illumination method.

(Embodiment 17)

Figure 20A:
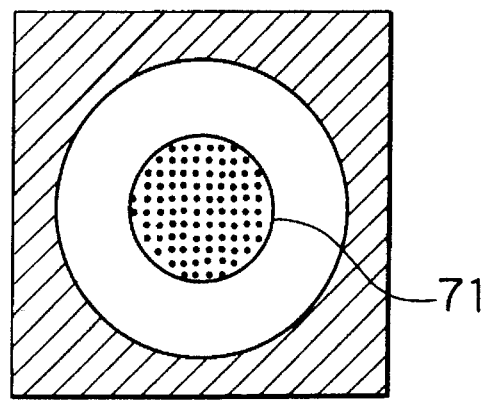
FIGS. 20a to 20d are diagrams of first spatial filters used in Embodiments 17 to 20, respectively.

An annular-band reflecting plate having a halftone portion formed of a halftone film 71 as shown in FIG. 20a may be used as the mirror 14 forming the first spatial filter of Embodiments 1 and 2, the first spatial filter 35a or 45a of Embodiments 5 to 8, or the first spatial filter 65a of Embodiments 11 and 12 to form a secondary light source surface in accordance with a halftone annular-band illumination method. Similarly, an annular-band-aperture filter having a halftone portion may be used as the first spatial filter 25a of Embodiments 3 and 4 or the first spatial filter 55a of Embodiments 9 and 10 to form a secondary light source surface in accordance with a halftone annular-band illumination method.

(Embodiment 18)

Figure 20B:
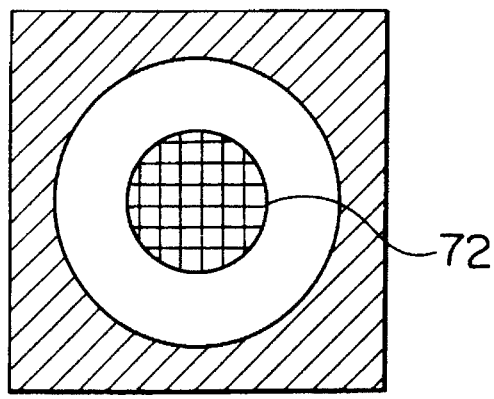

An annular-band reflecting plate having a halftone portion formed of a meshwork 72 as shown in FIG. 20b may also be used as the mirror 14 forming the first spatial filter of Embodiments 1 and 2, the first spatial filter 35a or 45a of Embodiments 5 to 8, or the first spatial filter 65a of Embodiments 11 and 12 to form a secondary light source surface in accordance with a halftone annular-band illumination method, as in the case of Embodiment 17. Similarly, an annular-band-aperture filter having a halftone portion formed of a meshwork may be used as the first spatial filter 25a of Embodiments 3 and 4 or the first spatial filter 55a of Embodiments 9 and 10 to form a secondary light source surface in accordance with a halftone annular-band illumination method.

(Embodiment 19)

Figure 20C:
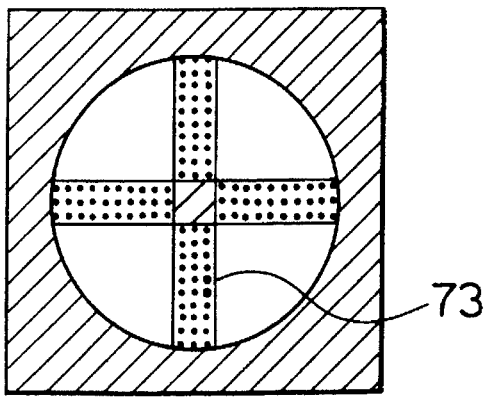

A split reflecting plate having halftone portions formed of a halftone film 73 as shown in FIG. 20c may be used as the mirror 14 forming the first spatial filter of Embodiments 1 and 2, the first spatial filter 35a or 45a of Embodiments 5 to 8, or the first spatial filter 65a of Embodiments 11 and 12 to form a secondary light source surface in accordance with a halftone split illumination method. Similarly, a split aperture filter having a halftone portion may be used as the first spatial filter 25a of Embodiments 3 and 4 or the first spatial filter 55a of Embodiments 9 and 10 to form a secondary light source surface in accordance with a halftone split illumination method.

(Embodiment 20)

Figure 20D:
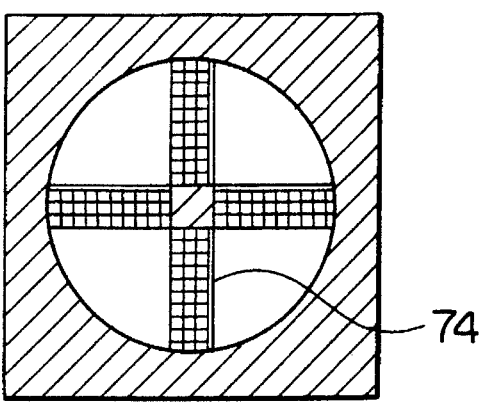

A split reflecting plate having halftone portions formed of a halftone meshwork 74 as shown in FIG. 20d may also be used as the mirror 14 forming the first spatial filter of Embodiments 1 and 2, the first spatial filter 35a or 45a of Embodiments 5 to 8, or the first spatial filter 65a of Embodiments 11 and 12 to form a secondary light source surface in accordance with a halftone split illumination method, as in the case of Embodiment 19. Similarly, a split aperture filter having a halftone portion formed of a meshwork may be used as the first spatial filter 25a of Embodiments 3 and 4 or the first spatial filter 55a of Embodiments 9 and 10 to form a secondary light source surface in accordance with a halftone split illumination method.

(Embodiment 21)

In the above-described Embodiments 1 to 12, a phase shift mask may be used as reflection type mask 15 to improved pattern imaging characteristics. Related phase shift methods are disclosed in JJAP, Vol. 31 (1992), pp4131- 4136.

Figure 21A:
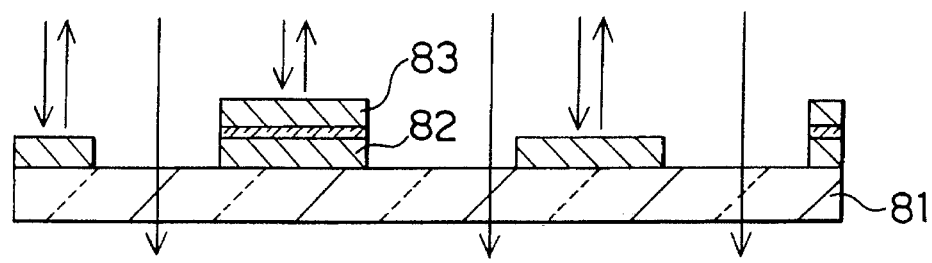
FIGS. 21a to 21d are diagrams of reflection type masks used in Examples 21 to 24, respectively.

For example, a spatial frequency modulation type phase shift mask such as that shown in FIG. 21a may be used to improve the resolution. This mask is formed in such a manner that reiterative patterns are formed of a first reflecting film 82 on a transparent substrate 81, and a layer of a second reflecting film 83 is formed on every other reiterative pattern. For example, diamond-like carbon (DLC) film is used as transparent substrate 81, and gold or tungsten is used as first and second reflecting films 82 and 83. Reflected light from the first reflecting film 82 and reflected light from the second reflecting film 83 act to cancel out each other by the effect of a phase difference therebetween.

(Embodiment 22)

Figure 21B:
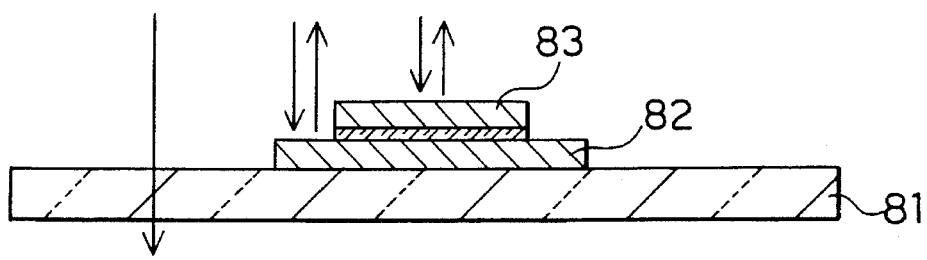

In the above-described Embodiments 1 to 12, a rim type edge-enhancing phase shift mask such as that shown in FIG. 21b may be used as reflection type mask 15 to obtain a sharper projected image. This mask is formed in such a manner that first reflecting mask 82 is formed on transparent substrate 81, and an isolated reflecting pattern is formed of second reflecting film 83 on first reflecting film 82. First reflecting film 82 has an exposed portion having a predetermined width around the isolated pattern formed of second reflecting film 83. A hem portion of an optical image of the isolated pattern is canceled out by reflected light from the exposed first reflecting film 82, thereby improving the optical image.

(Embodiment 23)

Figure 21C:
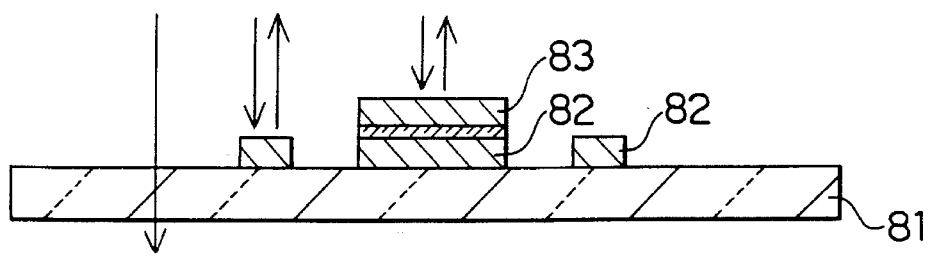

In the above-described Embodiments 1 to 12, an outrigger type edge-enhancing phase shift mask such as that shown in FIG. 21c may be used as reflection type mask 15. A sharper projected image can be obtained thereby, as in the case of Embodiment 22. This mask is formed in such a manner that an isolated pattern is formed of a lamination of first reflecting film 82 and second reflecting film 83 on transparent substrate 81, and an auxiliary reflecting film pattern formed of first reflecting film 82 and having a width smaller than a resoluble width is disposed at a distance from a peripheral end of the isolated pattern. An optical image of the isolated pattern can be improved by diffracted light from the auxiliary reflecting film.

(Embodiment 24)

Figure 21D:
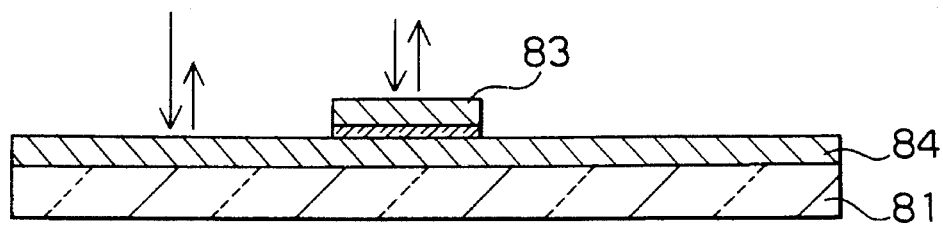

In the above-described Embodiments 1 to 12, a halftone type phase shift mask such as that shown in FIG. 21d may be used as reflection type mask 15. A sharper projected image can also be obtained thereby. This mask is formed in such a manner that halftone film 84 of, for example, copper or the like capable of being maintained in a halftone state with respect to an X-ray range is formed on one surface of transparent substrate 81 through the entire area thereof, and an isolated reflecting pattern is formed of second reflecting film 83 on halftone film 84. A hem portion of an optical image of the isolated pattern is canceled out by a phase difference of reflected light according to the difference between the surface heights of halftone film 84 and second reflecting film 83, thereby improving the optical image.

(Embodiment 25)

Figure 22A:
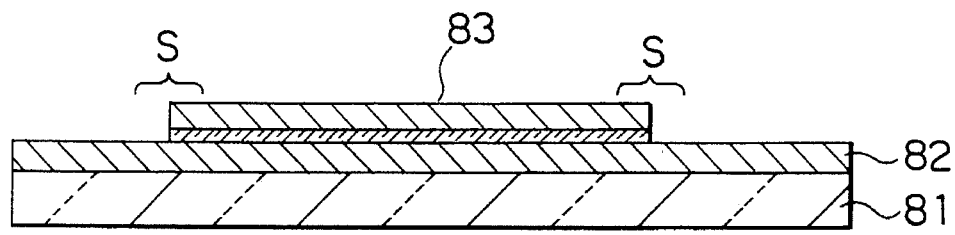
FIGS. 22a to 22d are diagrams of reflection type masks used in Examples 25 to 28, respectively.

In the above-described Embodiments 1 to 12, an edge line type phase shift mask such as that shown in FIG. 22a may be used as reflection type mask 15 to improve the resolution. This mask is formed in such a manner that first reflecting film 82 is formed on one surface of transparent substrate 81 through the entire area thereof, and a large pattern of second reflecting film 83 is formed on first reflecting film 82. A shading portion S is formed at the edge of second reflecting film 83 by the effect of interference between reflected light from first reflecting film 82 and reflected light from second reflecting film 83.

(Embodiment 26)

Figure 22B:
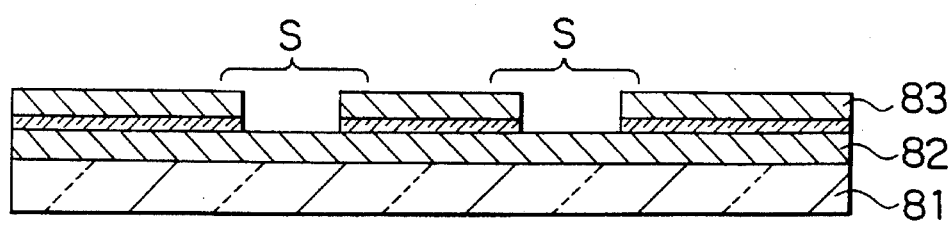

In the above-described Embodiments 1 to 12, a shifter shading type phase shift mask such as that shown in FIG. 22b may be used as reflection type mask 15 to improve the contrast of a projected image. This mask is formed in such a manner that first reflecting film 82 is formed on one surface of transparent substrate 81 through the entire area thereof, and predetermined patterns of second reflecting film 83 are disposed on first reflecting film 82. A shading portion S is formed on peripheral portions of the patterns of Second reflecting film 83 by the effect of interference between reflected light from first reflecting film 82 and reflected light from second reflecting film 83.

(Embodiment 27)

Figure 22C:
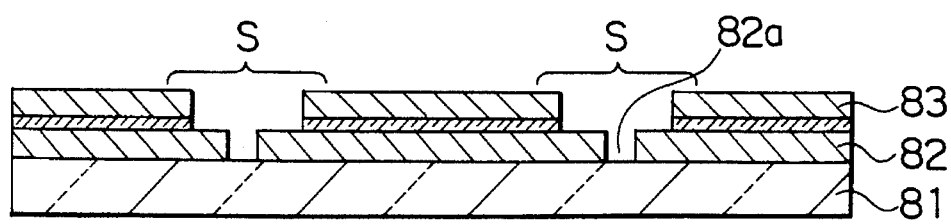

In the above-described Embodiments 1 to 12, a shifter shading type phase shift mask having a shading portion such as that shown in FIG. 22c may be used as reflection type mask 15 to improve the contrast of a projected image. This mask is formed in such a manner that an aperture 82a is formed in the first reflecting film 82 of the mask of Embodiment 26, whereby a larger shading portion S is formed.

(Embodiment 28)

Figure 22D:
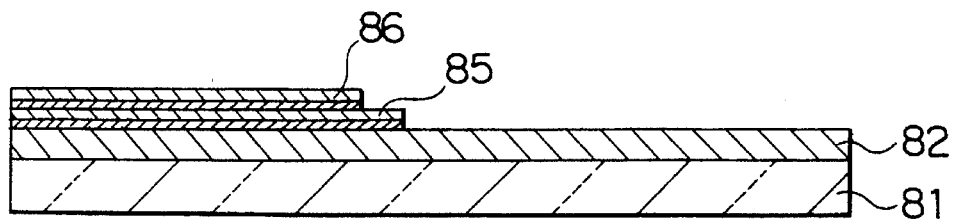

In the above-described Embodiments 1 to 12, a multiple stage type phase shift mask having such as that shown in FIG. 22d may be used as reflection type mask 15 to increase the freedom of pattern layout. This mask is formed in such a manner that first reflecting film 82 is formed on one surface of transparent substrate through the entire area thereof, and third reflecting film 83 and fourth reflecting film 86 are formed on first reflecting film 82 in a multiple stage structure. Reflected light from third reflecting film 85 has an intermediate phase between the phases of reflected light from first reflecting film 82 and reflected light from fourth reflecting film 86, whereby occurrence of a dark patter at the end of fourth reflecting film 86 is prevented. It is therefore possible to freely cut the pattern of fourth reflecting film 86.

(Embodiment 29)

The pupil surface of the projection optical system is at an incidence pupil position as viewed from the wafer 17. Accordingly, the second spatial filter disposed on the pupil surface functions as a pupil filter. Pupil filters are described in "Kohgaku (Optics) II", first impression, published by Misuzu Shobo, pp185–196.

Figure 23A:
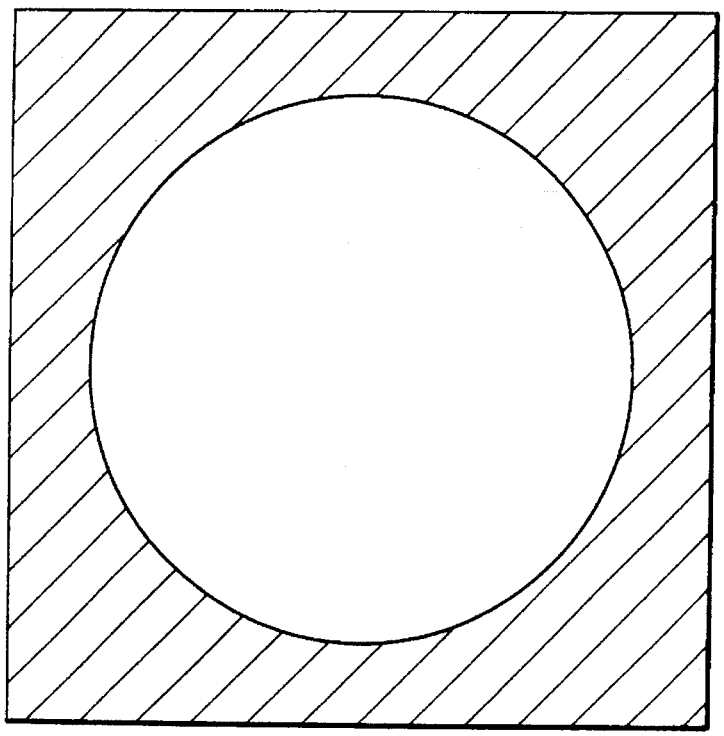
FIGS. 23a and 23b are diagrams of second spatial filters used in Embodiments 29 and 30, respectively.

A circular reflecting plate such as that shown in FIG. 23a may be used as the mirror 16 forming the second spatial filter of Embodiments 1 and 2, the second spatial filter 35b or 45b of Embodiments 5 to 8 or the second spatial filter 65b of Embodiments 11 and 12 to form a pupil surface having an ordinary circular shape. Similarly, a circular aperture filter may be used as the second circular filter 25b of Embodiments 3 and 4 or the second spatial filter 55b of Embodiments 9 and 10 to form a pupil surface having an ordinary circular shape.

(Embodiment 30)

Figure 23B:
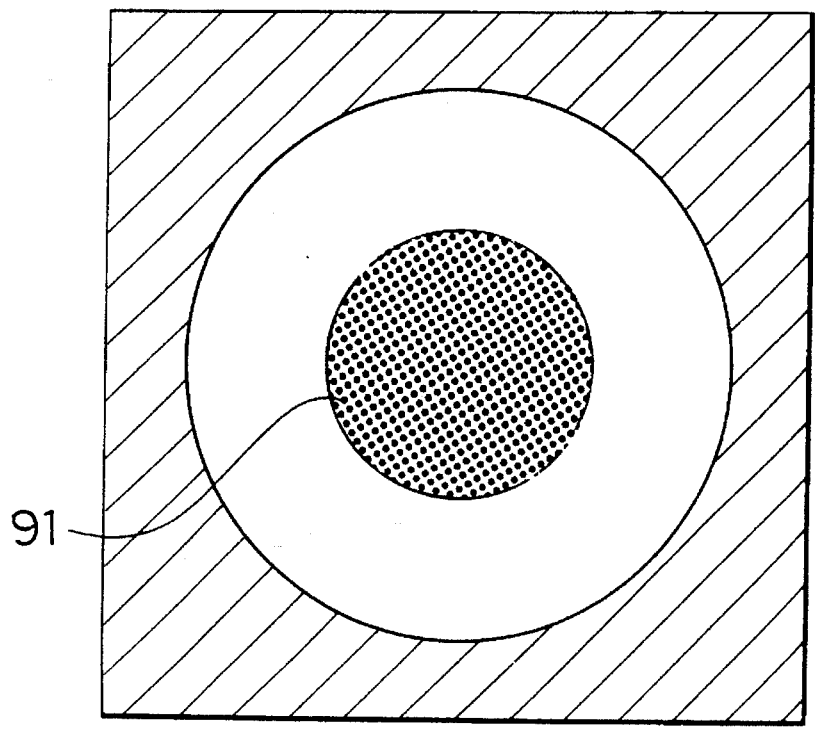

An annular-band phase reflecting plate having a halftone portion 91 as shown in FIG. 23b may be used as the mirror 16 forming the second spatial filter of Embodiments 1 and 2, the second spatial filter 35b or 45b of Embodiments 5 to 8 or the second spatial filter 65b of Embodiments 11 and 12 to form an annular-band phase filter on the pupil surface, thereby increasing the depth of focus. Similarly, an annular-band phase filter may be used as the second circular filter 25b of Embodiments 3 and 4 or the second spatial filter 55b of Embodiments 9 and 10 to increase the depth of focus.

(Embodiment 31)

Figure 24A:
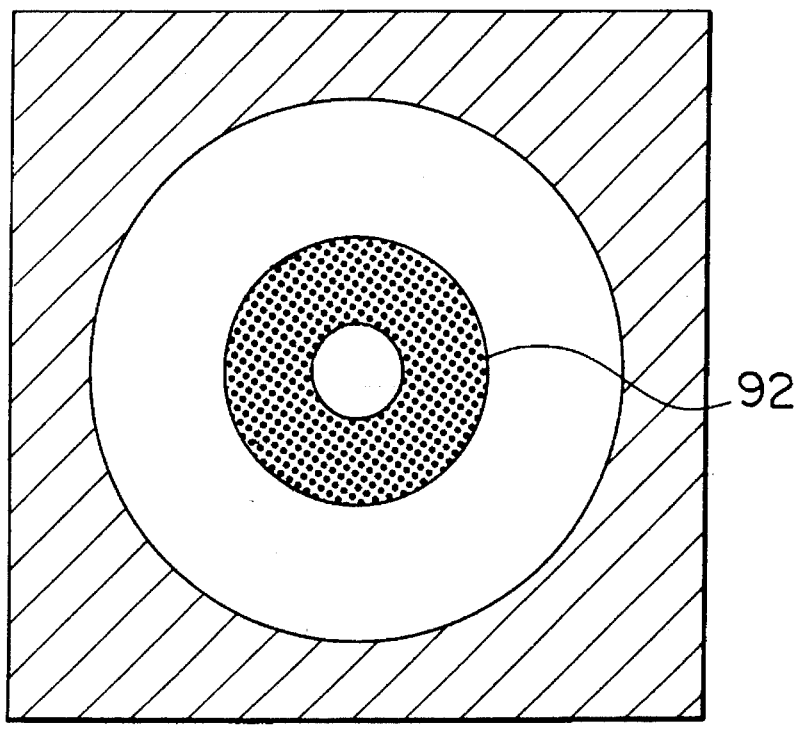
FIGS. 24a and 24b are diagrams of second spatial filters used in Embodiments 31 and 32, respectively.

A conjugate type phase reflecting plate having a halftone portion 92 as shown in FIG. 24a may be used as the mirror 16 forming the second spatial filter of Embodiments 1 and 2, the second spatial filter 35b or 45b of Embodiments 5 to 8 or the second spatial filter 65b of Embodiments 11 and 12 to form a conjugate type phase filter on the pupil surface, thereby increasing the depth of focus. Similarly, a conjugate type phase filter may be used as the second circular filter 25b of Embodiments 3 and 4 or the second spatial filter 55b of Embodiments 9 and 10 to increase the depth of focus.

(Embodiment 32)

Figure 24B:
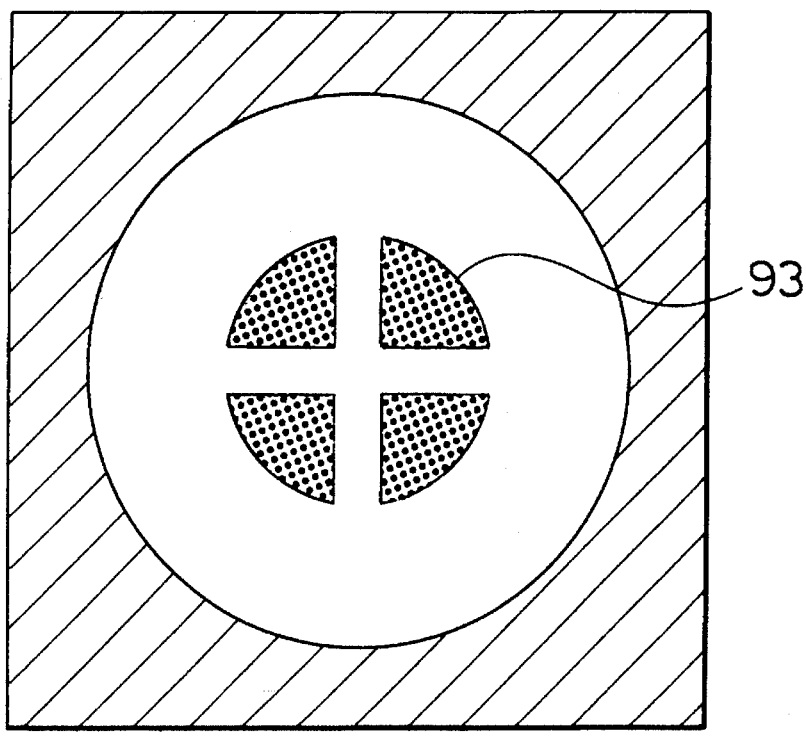

A four-split phase reflecting plate having a halftone portion 93 as shown in FIG. 24b may be used as the mirror 16 forming the second spatial filter of Embodiments 1 and 2, the second spatial filter 35b or 45b of Embodiments 5 to 8 or the second spatial filter 65b of Embodiments 11 and 12 to form a four-split phase filter on the pupil surface, thereby increasing the depth of focus. Similarly, a four-split phase filter may be used as the second circular filter 25b of Embodiments 3 and 4 or the second spatial filter 55b of Embodiments 9 and 10 to increase the depth of focus.

What is claimed is:

1. A projection exposure apparatus comprising:
    a beam source for emitting a beam of electromagnetic radiation having a wavelength between an X-ray region and a vacuum ultraviolet region;
    a reflection mask on which a circuit pattern is present;
    an illumination optical system for forming a secondary light source surface from the beam emitted by said beam source and for irradiating said reflection mask with the beam from the secondary light source surface, said illumination optical system including a first ellipsoidal mirror having first and second focal points, said reflection mask being located at the first focal point of said first ellipsoidal mirror and the secondary light surface being located on said first ellipsoidal mirror; and
    a projection optical system for projecting the circuit pattern on a wafer by converging on the wafer the beam reflected from said reflection mask, said projection optical system including a second ellipsoidal mirror having first and second focal points, said reflection mask being located at the first focal point of said second ellipsoidal mirror and the wafer being located at the second focal point of said second ellipsoidal mirror.

2. The projection exposure apparatus according to claim 1 comprising a spatial filter disposed on the secondary light source surface.

3. The projection exposure apparatus according to claim 2 wherein said spatial filter comprises a reflection filter.

4. The projection exposure apparatus according to claim 3 wherein said spatial filter comprises a mirror of a single crystal for generating asymmetric diffracted light.

5. The projection exposure apparatus according to claim 2 wherein said spatial filter comprises an absorption filter.

6. The projection exposure apparatus according to claim 1 wherein said reflection mask comprises a phase shift mask.

7. The projection exposure apparatus according to claim 1 wherein said illumination optical system comprises a parabolic mirror disposed between said beam source and said first ellipsoidal mirror.

8. The projection exposure apparatus according to claim 1 including a stop interposed between said first ellipsoidal mirror and said parabolic mirror at the second focal point of said first ellipsoidal mirror.

9. A projection exposure apparatus comprising:
    a beam source for emitting a beam of electromagnetic radiation having a wavelength between an X-ray region and a vacuum ultraviolet region;
    a reflection mask on which a circuit pattern is present;
    an illumination optical system including a plurality of parabolic mirrors for irradiating said reflection mask with the beam emitted by said beam source; and
    a projection optical system for forming a pupil surface from the beam reflected from said reflection mask and for projecting the circuit pattern on a wafer by converging on the wafer the beam from the pupil surface.

10. The projection exposure apparatus according to claim 9 wherein said illumination optical system comprises three parabolic mirrors.

11. The projection exposure apparatus according to claim 9 wherein said projection optical system comprises a parabolic mirror.

12. The projection exposure apparatus according to claim 9 comprising a spatial filter disposed on the pupil surface.

13. The projection exposure apparatus according to claim 12 wherein said spatial filter comprises a reflection filter.

14. The projection exposure apparatus according to claim 13 wherein said spatial filter comprises a mirror of a single crystal for generating asymmetric diffracted light.

15. The projection exposure apparatus according to claim 12 wherein said spatial filter comprises an absorption filter.

16. The projection exposure apparatus according to claim 9 wherein said reflection mask comprises a phase shift mask.

* * * * *